(12) United States Patent
Imamura et al.

(10) Patent No.: US 9,310,453 B2
(45) Date of Patent: Apr. 12, 2016

(54) MAGNETIC RESONANCE IMAGING APPARATUS

(71) Applicants: KABUSHIKI KAISHA TOSHIBA, Tokyo (JP); TOSHIBA MEDICAL SYSTEMS CORPORATION, Tochigi-Ken (JP)

(72) Inventors: Naho Imamura, Nasushiobara (JP); Masao Yui, Tochigi-Ken (JP)

(73) Assignees: KABUSHIKI KAISHA TOSHIBA, Tokyo (JP); TOSHIBA MEDICAL SYSTEMS CORPORATION, Otawara-Shi, Tochigi-ken ( * ) Notice: Subject to any disclaimer, the term of this patent is extended or adjusted under 35 U.S.C. 154(b) by 710 days.

(21) Appl. No.: 13/669,703

(22) Filed: Nov. 6, 2012

(65) Prior Publication Data

US 2013/0113486 A1   May 9, 2013

(30) Foreign Application Priority Data

Nov. 9, 2011   (JP) ................................. 2011-245176

(51) Int. Cl.
*G01V 3/00* (2006.01)
*G01R 33/58* (2006.01)
*G01R 33/341* (2006.01)
*G01R 33/54* (2006.01)
(Continued)

(52) U.S. Cl.
CPC .............. *G01R 33/58* (2013.01); *G01R 33/341* (2013.01); *G01R 33/543* (2013.01); *G01R 33/3415* (2013.01); *G01R 33/56383* (2013.01)

(58) Field of Classification Search
CPC ....................................................... G01R 33/58

USPC ........................................................... 324/322
See application file for complete search history.

(56) References Cited

U.S. PATENT DOCUMENTS 6,782,071 B1    8/2004   Tsuyuki
6,836,116 B2 *  12/2004  King et al. .................... 324/318
(Continued)

FOREIGN PATENT DOCUMENTS

CN          1444431 A      9/2003
CN          1775173 A      5/2006
(Continued)

OTHER PUBLICATIONS

CN Office Action dated Jun. 27, 2014 in CN 201210478555.8.
(Continued)

*Primary Examiner* — Rodney Fuller
(74) *Attorney, Agent, or Firm* — Nixon & Vanderhye P.C.

(57) ABSTRACT

An MRI (magnetic resonance imaging) apparatus includes a main scan executing unit for executing a main scan, an image reconstruction unit for reconstructing image data based on MR signals acquired in the main scan, a calibration scan setting unit, a calibration scan executing unit, and a condition determining unit. The calibration scan setting unit calculates a condition of a calibration scan for determining an imaging condition of the main scan or a condition of correction processing of the image data, based on a type of an RF coil device and an imaging part. The calibration scan executing unit executes the calibration scan based on the condition of the calibration scan. The condition determining unit determines the imaging condition of the main scan or the condition of the correction processing, based on an execution result of the calibration scan.

20 Claims, 14 Drawing Sheets

(51) Int. Cl.
  *G01R 33/3415* (2006.01)
  *G01R 33/563* (2006.01)

(56) References Cited

U.S. PATENT DOCUMENTS

| | | | |
|---|---|---|---|
| 8,125,222 B2 | 2/2012 | Sugiura | |
| 8,570,041 B2* | 10/2013 | Kubota et al. | 324/318 |
| 2003/0042905 A1 | 3/2003 | Miyazaki et al. | |
| 2003/0132750 A1* | 7/2003 | Machida et al. | 324/322 |
| 2006/0106299 A1 | 5/2006 | Uchizono et al. | |
| 2006/0261810 A1* | 11/2006 | Fautz et al. | 324/309 |
| 2007/0276221 A1 | 11/2007 | Warntjes | |
| 2007/0287904 A1* | 12/2007 | Li et al. | 600/410 |
| 2010/0321016 A1 | 12/2010 | Sugiura | |
| 2011/0121829 A1 | 5/2011 | Umeda et al. | |
| 2011/0121831 A1 | 5/2011 | Kubota et al. | |
| 2012/0105064 A1* | 5/2012 | Kumar et al. | 324/322 |
| 2013/0279779 A1* | 10/2013 | Darrow et al. | 382/131 |
| 2014/0055135 A1* | 2/2014 | Nielsen et al. | 324/309 |
| 2014/0055140 A1 | 2/2014 | Umeda et al. | |
| 2014/0203804 A1* | 7/2014 | Duensing | 324/307 |
| 2014/0239950 A1* | 8/2014 | Ookawa | 324/309 |
| 2014/0247046 A1* | 9/2014 | Grinstead | 324/309 |
| 2014/0333306 A1* | 11/2014 | Ham | 324/322 |
| 2015/0112186 A1* | 4/2015 | Rapoport et al. | 600/415 |

FOREIGN PATENT DOCUMENTS

| | | |
|---|---|---|
| CN | 1930485 A | 3/2007 |
| CN | 102068254 A | 5/2011 |
| JP | 2005-237703 | 9/2005 |
| JP | 2009-034152 | 2/2009 |
| JP | 2009-233323 | 10/2009 |
| JP | 2010-136828 | 6/2010 |
| JP | 2011-131045 | 7/2011 |
| JP | 2011-152348 | 8/2011 |

OTHER PUBLICATIONS

CN Office Action dated Feb. 28, 2015 in CN 201210478555.8.
Office Action dated Aug. 18, 2015 in JP 2011-245176.
CN Office Action dated Oct. 22, 2015 in CN 201210478555.8.

* cited by examiner

| | PARAMETER OF CONDITIONS / CORRESPONDING SETTING METHOD | OFFSET (x, y, z) | NoWrap | MATRIX | IMAGING PLANE /PE DIRECTION | SLICE THICKNESS | SLICE NUMBER | GAP | TR | FOV SIZE | BREATH HOLD | SELECTED COILS |
|---|---|---|---|---|---|---|---|---|---|---|---|---|
| SENSITIVITY DISTRIBUTION MAP | FIXED CONDITIONS | | ○ | ○ | ○ | ○ | ○ | | | | | |
| | CONDITIONS CALCULATED FROM CONDITIONS OF MAIN SCAN | ○ | | | | | | ○ | ○ | ○ | | |
| | CONDITIONS INCORPORATED BY REFERENCE TO CONDITIONS OF MAIN SCAN | | | | | | | | | | ○ | ○ |
| STATIC MAGNETIC FIELD CALIBRATION | FIXED CONDITIONS | | ○ | ○ | ○ | ○ | ○ | | | | | |
| | CONDITIONS CALCULATED FROM CONDITIONS OF MAIN SCAN | ○ | | | | | | ○ | ○ | ○ | | |
| | CONDITIONS INCORPORATED BY REFERENCE TO CONDITIONS OF MAIN SCAN | | | | | | | | | | ○ | ○ |

FIG. 6

MAGNETIC RESONANCE IMAGING APPARATUS

CROSS-REFERENCE TO RELATED APPLICATION

This application is based upon and claims the benefit of priority from Japanese Patent Application No. 2011-245176 filed on Nov. 9, 2011;

The entire contents of which are incorporated herein by reference.

BACKGROUND

1. Field

Embodiments described herein relate generally to magnetic resonance imaging (MRI).

2. Description of the Related Art

MRI is an imaging method which magnetically excites nuclear spins of an object (a patient) set in a static magnetic field with an RF pulse having the Larmor frequency and reconstructs an image based on MR signals generated due to the excitation. The aforementioned MRI means magnetic resonance imaging, the RF pulse means a radio frequency pulse, and the MR signal means a nuclear magnetic resonance (NMR) signal.

In MRI, an RF coil device corresponding to the imaging part is set on an object as a phased array coil and MR signals are detected by the RF coil device, in some cases. Generally, though sensitivity of a whole body coil built into an MRI apparatus is sufficiently uniform, sensitivity of respective coil elements inside RF coil devices each of which corresponds to a different imaging part is not so uniform as compared with the whole body coil. That is, even if the intensity of MR signals emitted from an object is uniform regardless of position, levels of detected signals become non-uniform and this degrades image quality.

Additionally, if an object is put in an imaging space where a static magnetic field with uniformity value higher than a predetermined value is formed, the uniformity of the static magnetic field is degraded due to difference in magnetic permeability between the inside of the object and its surrounding area.

Then, a prescan is performed before a main scan so as to determine conditions used in image reconstruction after the main scan and the imaging condition of the main scan based on the result of the prescan, in some cases. Note that, a "scan" means an operation acquiring MR signals and does not include image reconstruction.

As a prescan, for example, there are the following sequences: magnetic field measuring sequence for calculating an offset magnetic field (see, for example, Patent Document 1), b) a sequence for generating the sensitivity distribution map of the respective coil elements of an RF coil device (see, for example, Patent Document 2), and (c) a sequence for calculating a corrected value of the center frequency of RF pulses in the main scan (see, for example, Patent Document 3).

[Patent Document 1] Japanese Publication of Patent Application No. 2011-152348

[Patent Document 2] Japanese Publication of Patent Application No. 2005-237703

[Patent Document 3] Japanese Publication of Patent Application No. 2009-34152

The aforementioned offset magnetic field is used as an index of correction for uniformizing the static magnetic field of the main scan after the object is set in the imaging space.

Additionally, the aforementioned sensitivity distribution map is used to correct accident error of a luminance level of each pixel caused by non-uniform sensitivity of the phased array coil in image processing after the main scan and image reconstruction processing, for example.

Because the results of prescans have a large effect on the image quality of images obtained by the main scan, it is desired to perform a prescan under more appropriate conditions. However, conditions of a prescan are automatically set in a uniform manner regardless of the imaging conditions, or conditions of a prescan are manually set by a user in order for the conditions to become appropriate.

Therefore, MRI technology to appropriately set conditions of scans for calibration such as a prescan without manipulation by a user has been desired.

BRIEF DESCRIPTION OF THE DRAWINGS

In the accompanying drawings:

FIG. 6 is a table showing an example of a classification method of conditions of calibration scans by the calibration scan setting unit;

DETAILED DESCRIPTION

Figure 1:
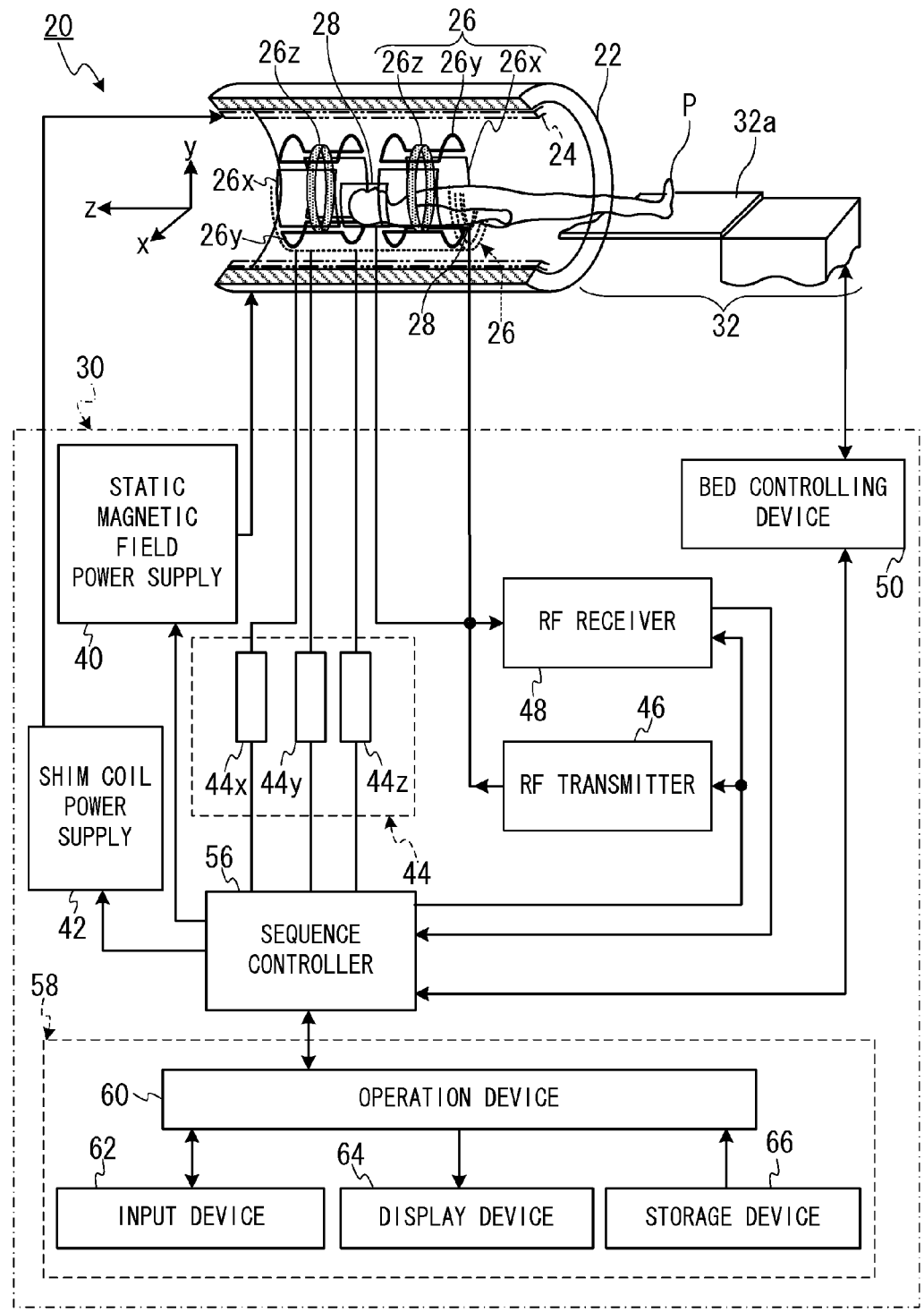
FIG. 1 is a block diagram showing general structure of the MRI apparatus of the first embodiment.

Hereinafter, examples of aspects which embodiments of the present invention can take will be explained per aspect.

(1) In one embodiment of the present invention, an MRI apparatus includes a main scan executing unit, an image reconstruction unit, a calibration scan setting unit, a calibration scan executing unit, and a condition determining unit.

The main scan executing unit executes an operation of transmitting an RF pulse based on determined imaging conditions and acquiring nuclear magnetic resonance signals via an RF coil device set on an imaging part of an object, as a main scan.

The image reconstruction unit reconstructs image data of the imaging part based on the nuclear magnetic resonance signals acquired in the main scan.

The calibration scan setting unit calculates conditions of a calibration scan whose execution result is used to determine an imaging condition of the main scan or a condition of correction processing of the image data, based on a type of the RF coil device and the imaging part.

The calibration scan executing unit executes the calibration scan based on the conditions of the calibration scan.

The condition determining unit determines the imaging condition of the main scan or the condition of the correction processing, based on an execution result of the calibration scan.

(2) An MRI apparatus of another embodiment of the present invention differs from the MRI apparatus of the above (1) only in the configuration of the calibration scan setting unit, as follows.

That is, the calibration scan setting unit classifies the conditions of the calibration scan into a condition set in a fixed manner regardless of the imaging conditions of the main scan, a condition to which a content of a corresponding condition of the main scan is applied without modification and a condition calculated based on at least one of the imaging conditions of the main scan, and calculates the conditions of the calibration scan based on at least one of the imaging conditions of the main scan.

(3) An MRI apparatus of another embodiment of the present invention differs from the MRI apparatus of the above (1) only in the configuration of the calibration scan setting unit and the calibration scan executing unit, as follows.

The calibration scan setting unit selects a sequence executed as the calibration scan out of a plurality of sequences stored as options based on at least one of the imaging conditions of the main scan, and calculates conditions of the selected sequence.

The calibration scan executing unit executes the selected sequence as the calibration scan, based on the conditions set by the calibration scan setting unit.

A magnetic resonance imaging apparatus and a magnetic resonance imaging method according to embodiments of the present invention will be described with reference to the accompanying drawings.

Note that the same reference numbers are given for identical components in each figure, and overlapping explanation is abbreviated.

First Embodiment

FIG. 1 is a block diagram showing general structure of the MRI apparatus 20 according to the first embodiment of the present invention.

As shown in FIG. 1, the MRI apparatus 20 includes a cylinder-shaped static magnetic field magnet 22 for generating a static magnetic field, a cylinder-shaped shim coil 24 coaxially-arranged inside the static magnetic field magnet 22, a gradient magnetic field coil 26, RF coils 28, a control device 30, and a bed 32 for placing an object (e.g. a patient) P on it.

Here, as one example, an apparatus coordinate system, whose X axis, Y axis and Z axis are perpendicular to each other, is defined as follows. Firstly, the direction of an axis of the static magnetic field magnet 22 and the shim coil 24 is aligned with the direction which is perpendicular to the vertical direction, and the direction of the axis of the static magnetic field magnet 22 and the shim coil 24 is defined as the Z axis direction.

Additionally, it is assumed that the vertical direction is the same as the Y axis direction. Moreover, the bed 32 is disposed in such a position that the direction of the normal line of the table plane thereof on which the object P is put is the same as the Y axis direction.

The control device 30 includes, for example, a static magnetic field power supply 40, a shim coil power supply 42, a gradient magnetic field power supply 44, an RF transmitter 46, an RF receiver 48, a bed controlling device 50, a sequence controller 56 and a computer 58.

The gradient magnetic field power supply 44 includes an X axis gradient magnetic field power supply 44x, a Y axis gradient magnetic field power supply 44y and a Z axis gradient magnetic field power supply 44z.

The computer 58 includes an operation device 60, an input device 62, a display device 64 and a storage device 66.

The static magnetic field magnet 22 is electrically connected to the static magnetic field power supply 40 and generates a static magnetic field in an imaging space by using electric current supplied from the static magnetic field power supply 40.

The aforementioned "imaging space" means, for example, a space in a gantry in which the object P is placed and to which a static magnetic field is applied. The term "gantry" refers to a structure having a cylindrical shape, for example, which includes a static magnetic field magnet 22, a shim coil 24, a gradient magnetic field coil 26, and RF coils 28. The gantry and a bed 32 are configured so that a table 32a (of the bed 32) on which the object P is placed can move to the inside of the gantry. For simplicity, FIG. 1 does not show the gantry itself but shows the static magnetic field magnet 22, the shim coil 24, the gradient magnetic field coil 26 and the RF coils 28 in the gantry as components of the gantry.

The imaging region means, for example, a region set as a part of the imaging space and is a range of acquisition of MR signals used to generate Hone image or one set of images. The one image or one set of images may be a two-dimensional image(s) or a three-dimensional image(s). Here, one set of images means, for example, a plurality of images when MR signals of the plurality of images are acquired in a lump in one pulse sequence such as multi-slice imaging.

The imaging region is defined three-dimensionally in an apparatus coordinate system, for example. In this specification, as an example, the imaging region will be referred to as "a slice" if the imaging region is a thin region or as "a slab" if the imaging region has a certain thickness.

The shim coil 24 is electrically connected to the shim coil power supply 42 and uniforms the static magnetic field with the electric current supplied from the shim coil power supply 42.

The static magnetic field magnet 22 includes a superconductivity coil in many cases. The static magnetic field magnet 22 gets electric current from the static magnetic field power supply 40 at excitation. However, once excitation has been made, the static magnetic field magnet 22 is usually isolated from the static magnetic field power supply 40. The static magnetic field magnet 22 may include a permanent magnet which makes the static magnetic field power supply 40 unnecessary.

The gradient magnetic field coil 26 includes an X axis gradient magnetic field coil 26x, a Y axis gradient magnetic field coil 26y and a Z axis gradient magnetic field coil 26z. Each of the X axis gradient magnetic field coil 26x, the Y axis gradient magnetic field coil 26y and the Z axis gradient magnetic field coil 26z is cylinder-shaped and arranged inside the static magnetic field magnet 22.

The X axis gradient magnetic field coil 26x, the Y axis gradient magnetic field coil 26y and the Z axis gradient magnetic field coil 26z are electrically connected to the X axis gradient magnetic field power supply 44x, the Y axis gradient magnetic field power supply 44y and the Z axis gradient magnetic field power supply 44z of the gradient magnetic field power supply 44, respectively.

The X axis gradient magnetic field power supply 44x, the Y axis gradient magnetic field power supply 44y and the Z axis gradient magnetic field power supply 44z supply electric current to the X axis gradient magnetic field coil 26x, the Y axis gradient magnetic field coil 26y and the Z axis gradient magnetic field coil 26z respectively so as to generate a gradient magnetic field Gx in the X axis direction, a gradient magnetic field Gy in the Y axis direction and a gradient magnetic field Gz in the Z axis direction in the imaging region.

That is, directions of a gradient magnetic field Gss in a slice selection direction, a gradient magnetic field Gpe in a phase encode direction and a gradient magnetic field Gro in a read-out (frequency encode) direction can be arbitrarily set as logical axes, by combining gradient magnetic fields Gx, Gy and Gz in the X axis, Y axis and Z axis directions as three physical axes.

The gradient magnetic fields Gss, Gpe and Gro in the slice selection direction, the phase encode direction and the readout direction are superimposed on the static magnetic field.

The RF transmitter 46 generates RF pulses in accordance with control information provided from the sequence controller 56, and outputs the generated RF pulses to the transmission RF coil 28.

The RF coils 28 include a whole body coil WB (see FIG. 5) built in the gantry for transmission and reception of RF pulses and local coils arranged around the bed 32 or the object P for reception of RF pulses.

The transmission RF coil 28 transmits an RF pulse given from the RF transmitter 46 to the object P. The reception RF coil 28 receives MR signals (nuclear magnetic resonance signals which are radio frequency signals) generated due to excited nuclear spin inside the object P by the RF pulse and these MR signals are detected by the RF receiver 48.

The RF receiver 48 generates raw data which are digitized complex number data of the MR signals obtained by performing A/D (analogue to digital) conversion after performing predetermined signal processing such as preamplification, intermediate-frequency conversion, phase detection, low-frequency amplification and filtering on the detected MR signals. The RF receiver 48 inputs the generated raw data to the sequence controller 56.

The operation device 60 performs system control of the MRI apparatus 20 in imaging operation, and its function will be explained later with FIG. 2.

The sequence controller 56 stores control information needed in order to make the gradient magnetic field power supply 44, the RF transmitter 46 and the RF receiver 48 drive. The aforementioned control information includes, for example, sequence information describing operation control information such as intensity, impression period and impression timing of the pulse electric current which should be impressed to the gradient magnetic field power supply 44.

The sequence controller 56 generates the gradient magnetic field Gx in the X axis direction, the gradient magnetic field Gy in the Y axis direction, the gradient magnetic field Gz in the Z axis direction and RF pulses by driving the gradient magnetic field power supply 44, the RF transmitter 46 and the RF receiver 48 according to a predetermined sequence stored. Additionally, the sequence controller 56 receives the raw data of MR signals inputted from the RF receiver 48, and input the raw data to the operation device 60.

The bed controlling device 50 is connected to the operation device 60 via the sequence controller 56. The sequence controller 56 moves the table 32a of the bed 32 in the Z axis direction of the apparatus coordinate system by controlling the bed controlling device 50 under the command of the operation device 60. This allows imaging according to a moving-table method or a stepping-table method.

The moving-table method is designed to widen the field of view (FOV) in the direction of movement, by continuously moving the table 32a of the bed 32 in the Z axis direction of the apparatus coordinate system during imaging.

The stepping-table method is designed to achieve three-dimensional imaging by moving the table 32a of the bed 32 in a stepped manner for each station.

These techniques are used for imaging of a wide area that cannot be imaged at once, such as imaging of the whole body. The operation device 60 also has a capability of combining a plurality of images taken by moving the table 32a into a composite image.

Figure 2:
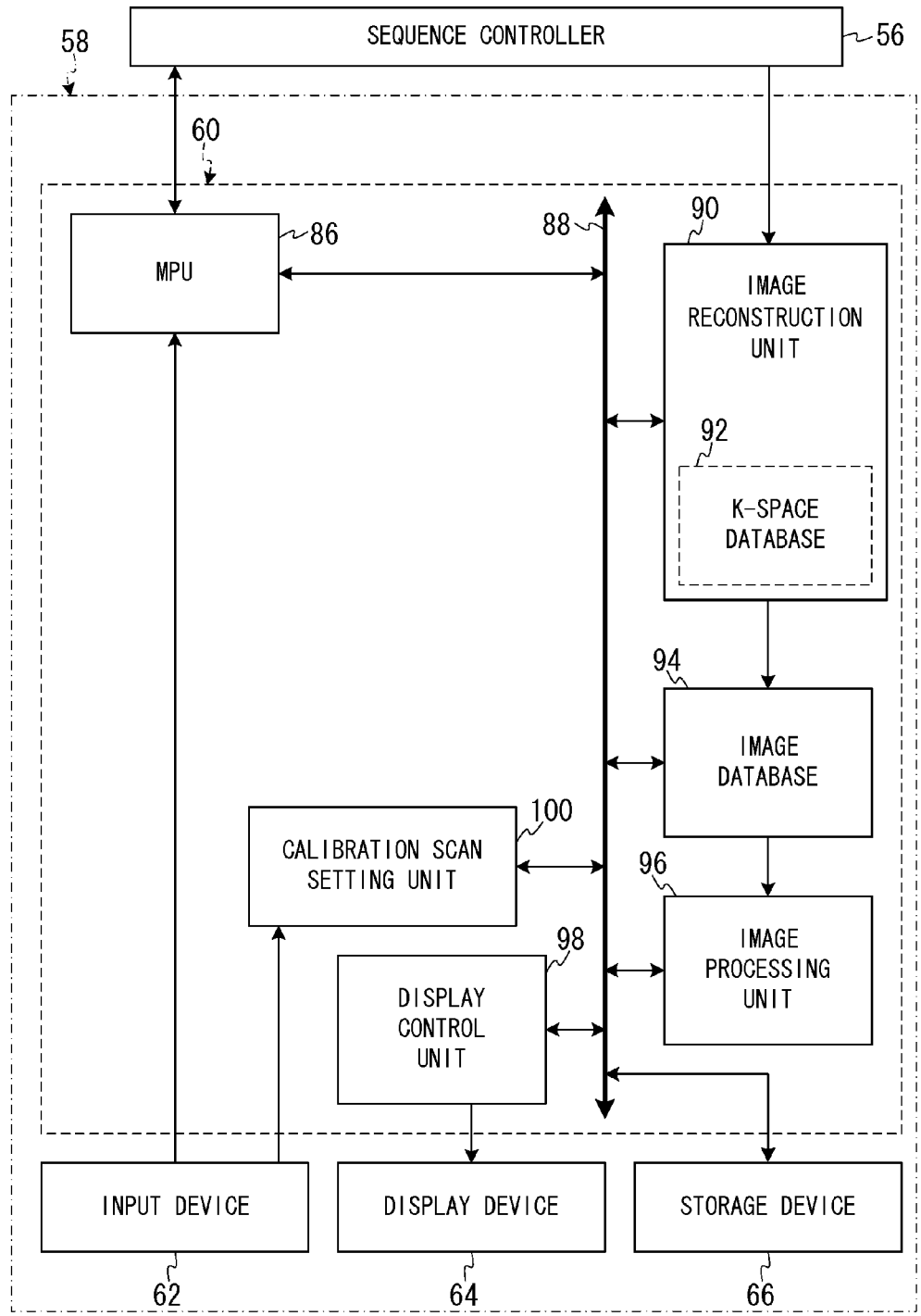
FIG. 2 is a functional block diagram of the computer 58 shown in FIG. 1.

FIG. 2 is a functional block diagram of the computer 58 shown in FIG. 1.

As shown in FIG. 2, the operation device 60 of the computer 58 includes an MPU (Micro Processor Unit) 86, a system bus 88, an image reconstruction unit 90, an image database 94, an image processing unit 96, a display controlling unit 98, and a calibration scan setting unit 100.

The MPU 86 performs system control of the MRI apparatus 20 in setting of imaging conditions (of a main scan), imaging operation and image display after imaging through interconnection such as the system bus 88.

The aforementioned term "imaging condition" refers to under what condition an RF pulses or the like is transmitted in what type of pulse sequence, such as spin echo or EPI, or under what condition MR signals are acquired from an object, for example.

As a parameter of the imaging conditions, for example, there are the imaging region as positional information in the imaging space, a flip angle, a repetition time (TR), the number of slices, FOV (Field Of View), an imaging part, the number of steps in the phase encode direction and the frequency encoding direction, and the type of the pulse sequence such as EPI and spin echo.

The "imaging part" means a region of the object P to be imaged, such as a head, a chest, an abdomen, a lumber and a leg.

Additionally, the MPU 86 functions as imaging conditions setting unit, sets imaging conditions including a pulse sequence such as FSE (Fast Spin Echo) based on command information from the input device 62, and inputs the set imaging conditions into the sequence controller 56. In order to achieve it, the MPU 86 controls the display controlling unit 98 and displays screen information for setting imaging conditions on the display device 64.

The input device 62 provides a user with a function to set imaging conditions and image processing conditions.

The image reconstruction unit 90 includes a k-space database 92 inside. The image reconstruction unit 90 arranges the raw data of MR signals inputted from the sequence controller 56 in the k-space formed in the k-space database 92 as k-space data. The image reconstruction unit 90 generates image data of each slice of the object P by performing image reconstruction processing including such as two-dimensional Fourier transformation. The image reconstruction unit 90 stores the generated image data in the image database 94.

The image processing unit 96 takes in the image data from the image database 94, performs predetermined image processing on them, and stores the image data after the image processing in the storage device 66 as display image data.

The storage device 66 stores the display image data after adding accompanying information such as imaging conditions used for generating the display image data and information of the object P (patient information) to the display image data.

The display controlling unit 98 displays a screen for setting imaging conditions and an image indicated by generated image data through imaging on the display device 64 under control of the MPU 86.

The calibration scan setting unit 100 calculates and automatically sets conditions of a calibration scan. In the broad sense, a calibration scan means, for example, a tuning scan performed aside from a main scan so as to determine an undetermined condition out of the imaging conditions of the main scan and/or data and a condition of correction processing for image data reconstructed after the main scan.

In the narrow sense, a calibration scan means, a tuning scan for adjusting a condition which is not set manually but have influence on image quality, in other words, a condition having influence on image quality, and the manual setting for this condition is invalid.

A condition having influence on image quality means, for example, (A) a sensitivity distribution map of respective coil elements of an RF coil device used for luminance correction after image reconstruction, (B) a center frequency of an RF pulse, (C) an intensity distribution of an offset magnetic field for correcting a static magnetic field. These (A), (B) and (C) are conditions for which manual input is not received in the input device 62 and the display device 64. That is, these (A), (B) and (C) are conditions for which a user does not execute manual setting.

Note that, regardless of whether it is narrowly interpreted or broadly interpreted, a calibration scan is a broader concept of a prescan and includes a tuning scan performed after a main scan.

In this specification, hereinafter, a calibration scan should be narrowly interpreted as descried above, and a calibration scan in the narrow sense includes, for example, the following sequences.

Firstly, it is a magnetic field measuring sequence of calculating an offset magnetic field for correcting a static magnetic field and this magnetic field measuring sequence is performed before a main scan.

Secondly, it is a sequence of calculating (a corrected value of) a center frequency of an RF pulse in a main scan, and this sequence is performed before the main scan. Note that, these magnetic field measuring sequence and the sequence for calculating a center frequency of an RF pulse may be performed as one calibration scan as described later.

Thirdly, it is a sequence of generating a sensitivity distribution map of respective coil elements inside an RF coil device, and this can be performed after a main scan as well as before a main scan.

Additionally, "a main scan" is a scan for imaging an intended diagnosis image such as a T1 weighted image, and it does not include a scan for acquiring MR signals for a locator image or a scan for calibrations such as a calibration scan. A scan is an operation of acquiring MR signals, and it does not include image reconstruction processing.

The calculation method of a condition of a calibration scan by the calibration scan setting unit 100 and automatic determination method of a condition of a calibration scan by the calibration will be explained later.

Figure 3:
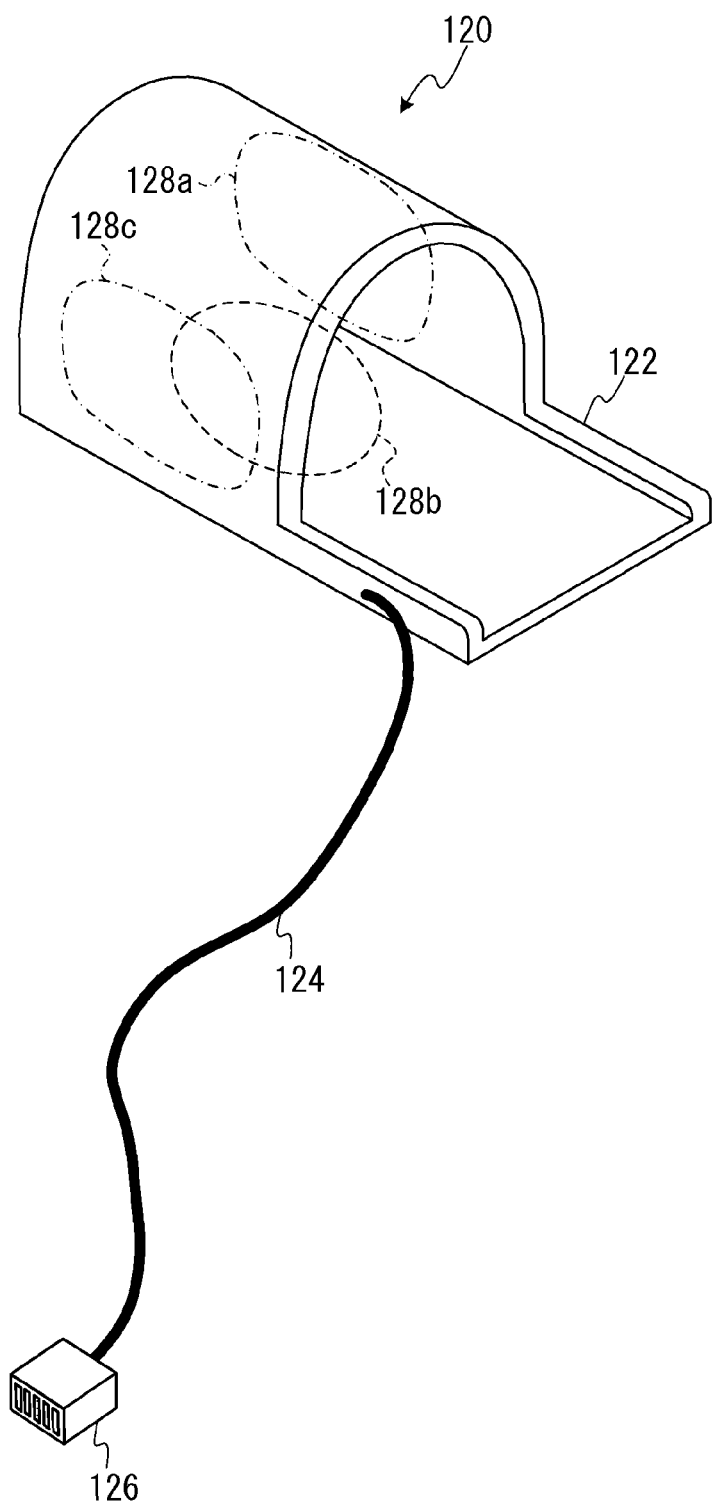
FIG. 3 is a schematic oblique drawing showing an example of structure of an RF coil device for the head, as an example of a wearable RF coil device detecting MR signals.

FIG. 3 is a schematic oblique drawing showing an example of structure of an RF coil device 120 for the head, as an example of a wearable RF coil device detecting MR signals;

As shown in FIG. 3, the RF coil device 120 for the head includes a housing 122, a cable 124, and a connector 126. Inside the housing 122, loop coil elements (surface coils) 128a, 128b and 128c are disposed.

Note that, the RF coil device 120 for the head is configured as a bidirectional coil, which can perform transmission of RF pulses as well as detection of MR signals. These transmitting and receiving functions are performed by the coil elements 128a, 128b and 128c. The coil elements 128a, 128b and 128c are electrically connected to discrete lines separately by heretofore known circuits including an amplifier circuit and the like inside the housing 122 (not shown). By connecting the connector 126 to a connection port (not shown) of the MRI apparatus 20, the coil elements 128a, 128b and 128c are connected to the RF transmitter 46 and the RF receiver 48 via the cable 124.

Electric power to the RF coil device 120 for the head is supplied from the MRI apparatus 20 via the cable 124, when the connector 126 is connected to the connection port of the MRI apparatus 20.

Note that, the RF coil device 120 for the head includes a control circuit (not shown) and a memory element (not shown) storing identification information of the RF coil device 120 for the head, inside the housing 122. When the connector 126 is connected to the connection port of the MRI apparatus 20, the identification information of the RF coil device 120 for the head is inputted from the control circuit into the MPU 86 via hard-wirings inside the MRI apparatus 20.

Figure 4:
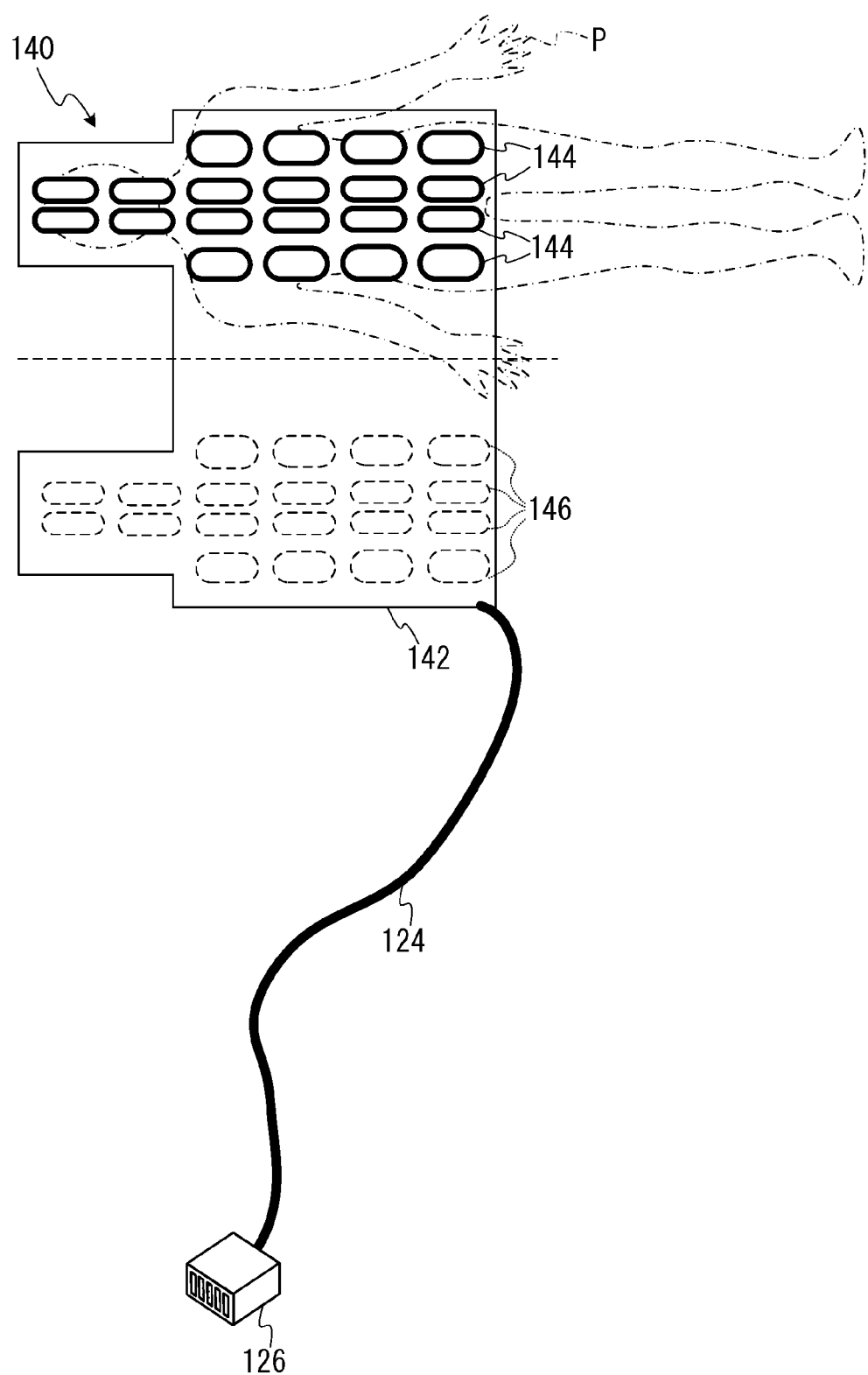
FIG. 4 is a schematic planimetric diagram showing an example of structure of an RF coil device for the upper half of the body, as an example of a wearable RF coil device detecting MR signals.

FIG. 4 is a schematic planimetric diagram showing an example of structure of an RF coil device 140 for the upper half of the body, as an example of a wearable RF coil device detecting MR signals.

As shown in FIG. 4, the RF coil device 140 for the upper half of the body includes a cover member 142, the cable 124 and the connector 126.

The cover member 142 is made of a flexible material and is capable of deformation such as folding. As such a deformable (flexible) material, for example, a flexible circuit board (Flexible Printed Circuit: FPC) described in Japanese Patent Application Laid-open (KOKAI) Publication No. 2007-229004 can be used.

For example, twenty coil elements (surface coils) 144 corresponding to the back side of the object P are disposed inside the upper half of the cover member 142 bisected by the horizontal dashed line in FIG. 4. Here, as an example, twelve of the coil elements 144 smaller than the rest of the coil elements 144 are arranged near the body axis, in terms of sensitivity improvement considering the backbone of the object P.

The bisected lower half of the cover member 142 is composed so as to overlay the head part, the chest part and the abdominal part of the object P. For example, twenty of coil elements (surface coils) 146 corresponding to the anterior side of the object P are disposed inside the lower half of the cover member 142. In FIG. 4, the coil elements 144 are shown by bold lines and the coil elements 146 are shown by dashed lines.

Note that, the RF coil device 140 for the upper half of the body includes a control circuit (not shown) and a memory element (not shown) storing identification information of the RF coil device 140 for the upper half of the body, inside the cover member 142. When the connector 126 is connected to the connection port of the MRI apparatus 20, the identification information of the RF coil device 140 for the upper half of the body is inputted from the control circuit into the MPU 86 via hard-wirings inside the MRI apparatus 20.

Figure 5:
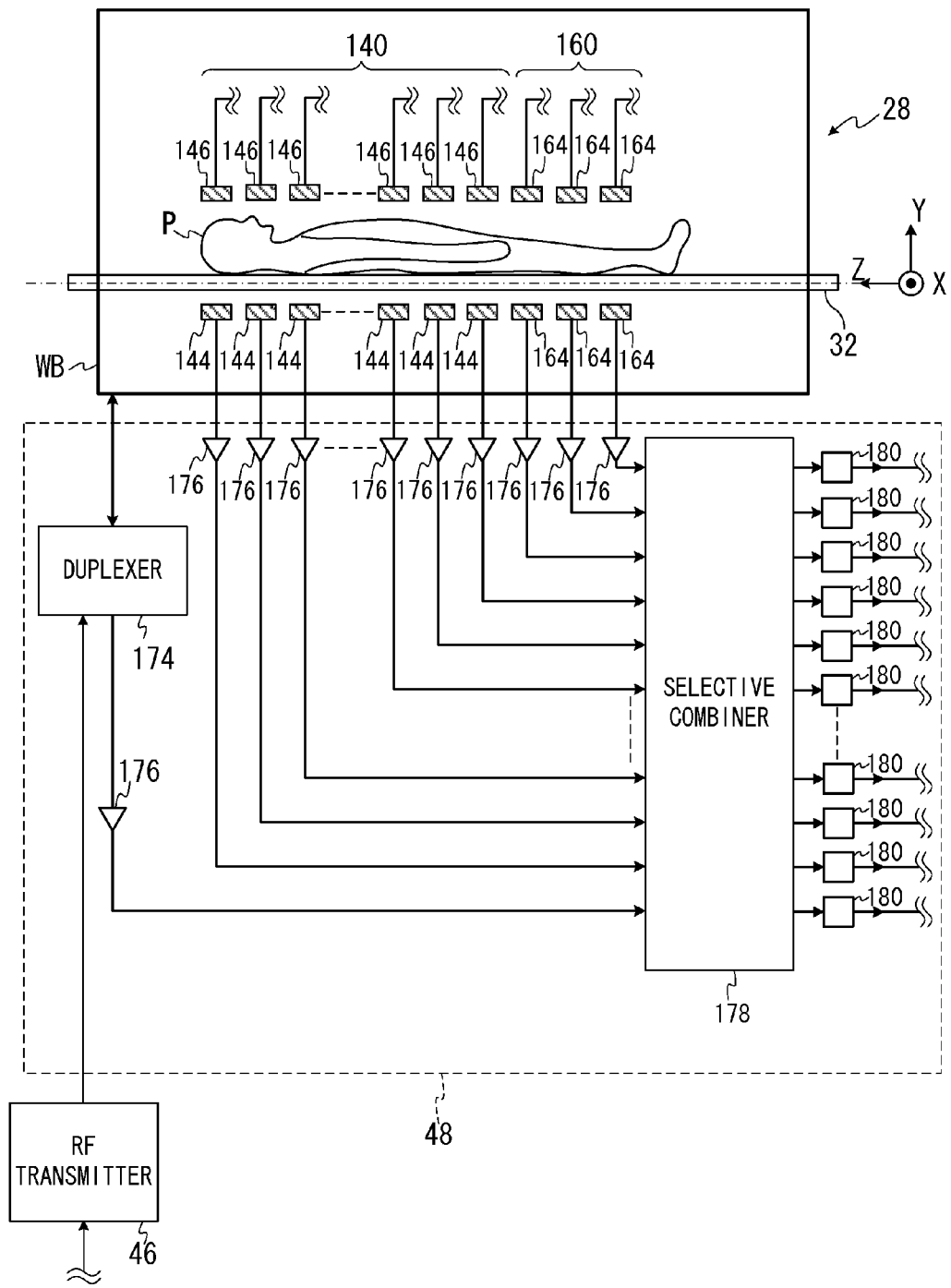
FIG. 5 is a block diagram showing an example of detailed structure of the RF receiver in FIG. 1.

FIG. 5 is a block diagram showing an example of detailed structure of the RF receiver 48 in FIG. 1. Here, as an example, it is assumed that the RF coil device 140 for the upper half of the body and a wearable RF coil device 160 for the lower half of the body receiving MR signals are set on the object P. The RF coil device 160 for the lower half of the body includes many coil elements 164 detecting MR signals (for simplicity, only six coil elements 164 are shown in FIG. 5).

In this case, the RF coil 28 includes a cylinder-shaped whole body coil WB shown as a rectangle shown by a bold line in the drawing, the coil elements 144, 146 of the RF coil device 140 for the upper half of the body, and the coil elements 164 of the RF coil device 160 for the lower half of the body. The coil element 144, 146 and 160 function as a phased array coil receiving MR signals. The whole body coil WB is arranged inside the gantry and is capable of both transmitting RF pulses and receiving MR signals as a bidirectional coil.

The RF receiver 48 includes a duplexer 174, a plurality of amplifiers 176, a selective combiner 178, and a plurality of receiving-system circuits 180. The input side of the selective combiner 178 is separately connected to the coil elements 144, 146 and 164 via the amplifiers 176. The input side of the selective combiner 178 is separately connected to the whole body coil WB via the duplexer 174 and the amplifier 176. The receiving-system circuits 180 are individually connected to the output side of the selective combiner 178.

The duplexer 174 receives an RF pulse from the RF transmitter 46, and transmits the received RF pulse to the whole body coil WB. Additionally, the duplexer 174 inputs MR signals received by the whole body coil WB to the amplifier 176, and the MR signals are amplified by the amplifier 176 and then provided to the input side of the selective combiner 178. The MR signals received by the coil elements 144, 146 and 164 are also amplified by their respective amplifiers 176 and then provided to the input side of the selective combiner 178.

The selective combiner 178 performs selection and synthesis of the MR signals detected by the coil elements 144, 146, 164 and the whole body coil WB depending on the number of the receiving-system circuits 180, and outputs the resulting signals to corresponding receiving-system circuits 180 respectively. In this way, the MRI apparatus 20 produces a sensitivity distribution suitable for each imaging part by using the whole body coil WB and a desired number of the coil elements 144, 146, 164, and receives MR signals from various imaging parts.

Note that, the MRI apparatus 20 can receive MR signals by using only the whole body coil WB, without arranging the coil elements 144, 146 and 164. However, in the following explanation, a case in which one or a plurality of wearable RF coil device(s) is(are) used will be described as an example. Additionally, MR signals detected by the whole body coil WB and the coil elements 144, 146 and 164 may be directly inputted to the receiving-system circuits 180, omitting the selective combiner 178. Moreover, more number of the coil elements may be disposed over a wide range.

Note that, it is assumed that the coil elements 144, 146 of the RF coil device 140 for the upper half of the body, and the coil elements 164 of the RF coil device 160 for the lower half of the body are a part of the RF coil 28, in the above explanation. That is, it is assumed that the RF coil device 140 for the upper half of the body and the RF coil device 160 for the lower half of the body are a part of the MRI apparatus 20, in the above explanation. However, this is for convenience of explanation. (Each coil element of) The RF coil device 140 for the upper half of the body and/or the RF coil device 160 for the lower half of the body may be regarded as separate parts independent of the MRI apparatus 20.

In the present embodiment, in addition to the above RF coil device 140 for the upper half of the body and RF coil device 160 for the lower half of the body, the various types of wearable RF coil devices such as an RF coil device for the chest, an RF coil device for the abdominal part, an RF coil device for the shoulder, an RF coil device for the cardiac region, an RF coil device for the lumbar part, an RF coil device for the knee region and the like can be used for receiving MR signals. These wearable RF coil devices may be interpreted as a part of the MRI apparatus 20, or may be interpreted as separate parts independent of the MRI apparatus 20.

FIG. 6 is a table showing an example of a classification method of conditions of calibration scans by the calibration scan setting unit 100. In FIG. 6, as an example, the sequence (calibration scan) for generating a sensitivity distribution map of each coil element of an RF coil device is shown in the upper part, and the magnetic field measuring sequence (calibration scan) for calculating an offset magnetic field to correct a static magnetic field is shown in the lower part. The calibration scan setting unit 100 classifies conditions of these calibration scans into three types shown in FIG. 6, and then calculates conditions each calibration scan.

The aforementioned three types are as follows.

Firstly, one of them is a condition (fixed condition) which is set in a fixed manner regardless of the imaging conditions of the main scan Secondly, another of them is a condition to which contents of corresponding imaging conditions of the main scan are applied without modification (conditions incorporated by reference to corresponding conditions of a main scan).

Thirdly, another of them is "a condition calculated based on at least one of the imaging conditions of a main scan.

In FIG. 6, as an example, eleven types of parameters of conditions of calibration scans are shown. Hereinafter, these parameters will be explained from the left side in order.

"Offset" is a coordinate point of the center of the imaging region in the apparatus coordinate system, when the imaging region is set as a volume combining entirety of a plurality of slices so as to image the plurality of slices as volume data. Note that, here, as an example, it is controlled in such a manner that the center of a magnetic field accord with the original point of the apparatus coordinate system. Thus, "offset" indicates positional difference between the center of a magnetic field and the center of the imaging region.

"Nowrap" is a condition as to whether the following processing is performed or not in order to remove wraparound artifact. That is, in this processing, an MRI image is obtained by enlarging FOV, and then a necessary region as an image is extracted from the obtained image so as to remove wraparound remove wraparound (aliasing).

"Matrix" is a matrix-like pixel number of an image, which is the product of a phase encode step number and a frequency encode step number.

"Imaging Plane/PE Direction" is a condition of how the direction of the phase encode is set in relation to the cross-section to be image.

"Slice Thickness" is a slice thickness of each MRI image.

"Slice Number" is a number of slices to be imaged.

"Gap" is an interval between two slices adjacent to each other.

"TR" is a repetition time.

"FOV Size" is a size of FOV (Field of View), and it means, for example, how long the horizontal and vertical sizes of FOV are in millimeter.

"Breath Hold" is a condition as to whether breath-holding imaging is performed or not.

"Selected Coils" are the coil elements selected to use for detecting MR signals in the main scan. Selection of the coil elements is, for example, performed after coil position measuring sequence (see Japanese Publication of Patent Application No. 2010-259777) is performed.

More specifically, for example, RF pulses are transmitted from the whole body coil WB, MR signals are acquired by a wearable RF coil device connected to the MRI apparatus 20, and then profile data for positioning coils are generated based on the acquired MR signals. Next, each position of each coil element in the RF coil device is calculated based on the profile data. After this, the MPU 86 automatically selects the coil elements used for detection of MR signals based on the respective positions of the coil elements, or a user selects the coil elements used for detection of MR signals after the respective positions of the coil elements are displayed on the display device 64.

Here, in FIG. 6, each of the parameters of the conditions is marked with a circle at only one of the aforementioned three types of conditions. The way of putting the circle mark per parameter for the calibration scan of generating a sensitivity distribution map shown in the upper side of FIG. 6 is the same as that of the calibration scan of measuring a magnetic field shown in the lower side of FIG. 6.

More specifically, as shown in FIG. 6, conditions of calibration scans such as Nowrap and Matrix are set in a fixed manner regardless of the imaging condition of the main scan. Additionally, conditions of calibration scans such as Offset, Gap, Repetition Time and FOV size are calculated at least one of (some of) the imaging conditions of the main scan. Additionally, conditions of calibration scans such as Breath Hold and Selected Coils are set by applying corresponding imaging conditions of the main scan without modification.

The calibration scan setting unit 100 classifies conditions of calibration scans into three types, and calculates conditions of calibration scans based on combination of a type of an RF coil device and an imaging part. As to this calculation, the calibration scan setting unit 100 obtains some of the already set imaging conditions of the main scan, and perform the above calculation based on the obtained imaging conditions.

More specifically, in the case of the combination of the chest as an imaging part and an RF coil device for the chest part to detect MR signals, conditions of the calibration scans are classified into three types by the position of circle marks shown in FIG. 6, calculated and automatically set. Similarly, in the case of the combination of the head as an imaging part and an RF coil device for the head to detect MR signals, conditions of calibration scans are classified into three types by the position of circle marks shown in FIG. 6, calculated and automatically set.

That is, regardless of the combination of the type of an RF coil device and the imaging part, conditions of calibration scans are classified into three types in the same way as the one shown by the position of circle marks in FIG. 6. However, even if imaging conditions of a main scan are the same each other, respective conditions of calibration scan changes depending on the combination of the type of an RF coil device and the imaging part, except the conditions which are set by applying corresponding imaging conditions of the main scan without modification.

More specifically, for example, in the case of the combination of the chest as an imaging part and an RF coil device for the chest part, Offset for the sequence of generating the sensitivity distribution map is, for example, calculated as (1,1,1) by applying a certain calculation method to the imaging conditions of the main scan, and Matrix is, for example, fixedly set as pixel number of 256×256.

On the other hand, in the case of the combination of the head as an imaging part and an RF coil device for the head, Offset for the sequence of generating the sensitivity distribution map is, for example, calculated as (2,2,2) by applying the aforementioned calculation method to the imaging conditions of the main scan, and Matrix is fixedly set as pixel number of 256×256 in the way similar to the above case.

Here, conditions of calibration scans set regardless of the imaging conditions of the main scan will be explained by using Matrix in the sequence of generating the sensitivity distribution map as an example. For example, when the number of coil elements arranged in an imaging region is relatively large for volume of the imaging region, the calibration scan setting unit 100 sets the Matrix as pixel number of 256×256. This is because the larger the number of coil elements is compared with volume of the imaging region, the more preferable it is to minutely detect distribution of signal levels of received MR signals so as to generate a more precise sensitivity distribution map.

On the other hand, when the number of coil elements arranged in an imaging region is relatively small for volume of the imaging region, the calibration scan setting unit 100 sets the Matrix as pixel number of 128×128.

Whether the number of coil elements arranged in an imaging region is relatively small or large for volume of the imaging region can be preliminarily determined based on the number of coil elements in an RF coil device obtained by identification information of this RF coil device and the imaging part.

As another example, Slice Number in the magnetic field measuring sequence for calculating an offset magnetic field will be explained. In this case, for example, the calibration scan setting unit 100 sets a slice number in such a manner that the slice number is not too small for the thickness of the imaging region (the thickness means a width in the direction of a normal line of a slice) and the slice number is not too large for the thickness of the imaging region. For example, assume that the head part is the imaging part and the slice number is 20. Then, in the case of the chest and abdominal parts as imaging parts, the slice number is set to 50. Note that, these setting methods are only examples and the present embodiment is not limited to the above setting methods.

As to other parameters set regardless of imaging conditions of the main scan, the calibration scan setting unit 100 stores appropriate values or set contents preliminarily calculated per sequence of calibration scans based on a type of an RF coil device and an imaging part, as table data. Thus, the calibration scan setting unit 100 obtains set contents of target parameters according to (A) a type of an RF coil device, (B) an imaging part, and (C) a type of sequence of the calibration scan.

Next, calculation method of conditions of calibration scans obtained by some of imaging conditions of the main scan will be explained by using FOV size and slice interval (GAP) as examples. Note that, here, as an example, FOV size and slice interval are calculated in the similar way, regardless of a type of an RF coil device and an imaging part.

Figure 7:
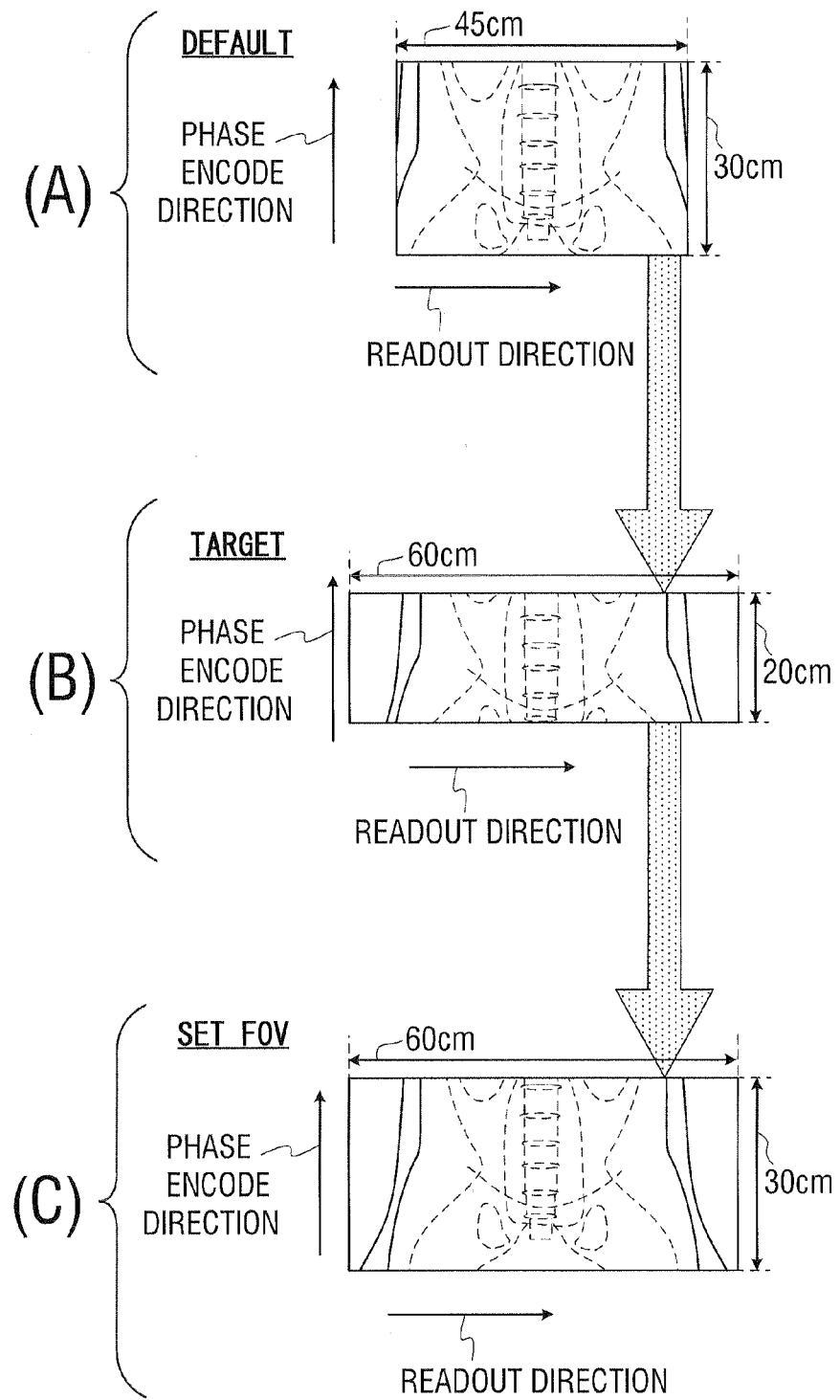
FIG. 7 is a schematic explanatory diagram showing an example of setting method of size of FOV.

FIG. 7 is a schematic explanatory diagram showing an example of setting method of size of FOV.

As an initial setting value (DEFAULT) of FOV of the calibration scan, here, as an example, 30 cm in the phase encode direction and 45 cm in the readout direction are set. For example, the calibration scan setting unit 100 sets FOV of the calibration scan to the minimum size or an arbitrary size within the range which satisfies the following two conditions both in the phase encode direction and in the readout direction.

The first condition is that FOV of the calibration scan does not become smaller than the default both in the phase encode direction and in the readout direction.

The second condition is that the FOV set by a user during a planning span of the imaging conditions of the main scan is included in the FOV automatically set by the calibration scan setting unit 100. Note that, as to the slice selection direction, GAP (the interval between slices adjacent to each other) is set so as to include imaging region, as discussed later.

FIG. 7 (A) shows the above initial setting value of FOV. Next, assume that a user sets FOV to 20 cm in the phase encode direction and 60 cm in the readout direction during a planning period of the imaging conditions of the main scan, for example. FIG. 7 (B) shows this state. In this case, the FOV size which is the minimum and satisfies the aforementioned two conditions is 30 cm in the phase encode direction and 60 cm in the readout direction. Thus, the calibration scan setting unit 100 sets the FOV of the calibration scan to the above values. FIG. 7 (C) shows this state.

Figure 8:
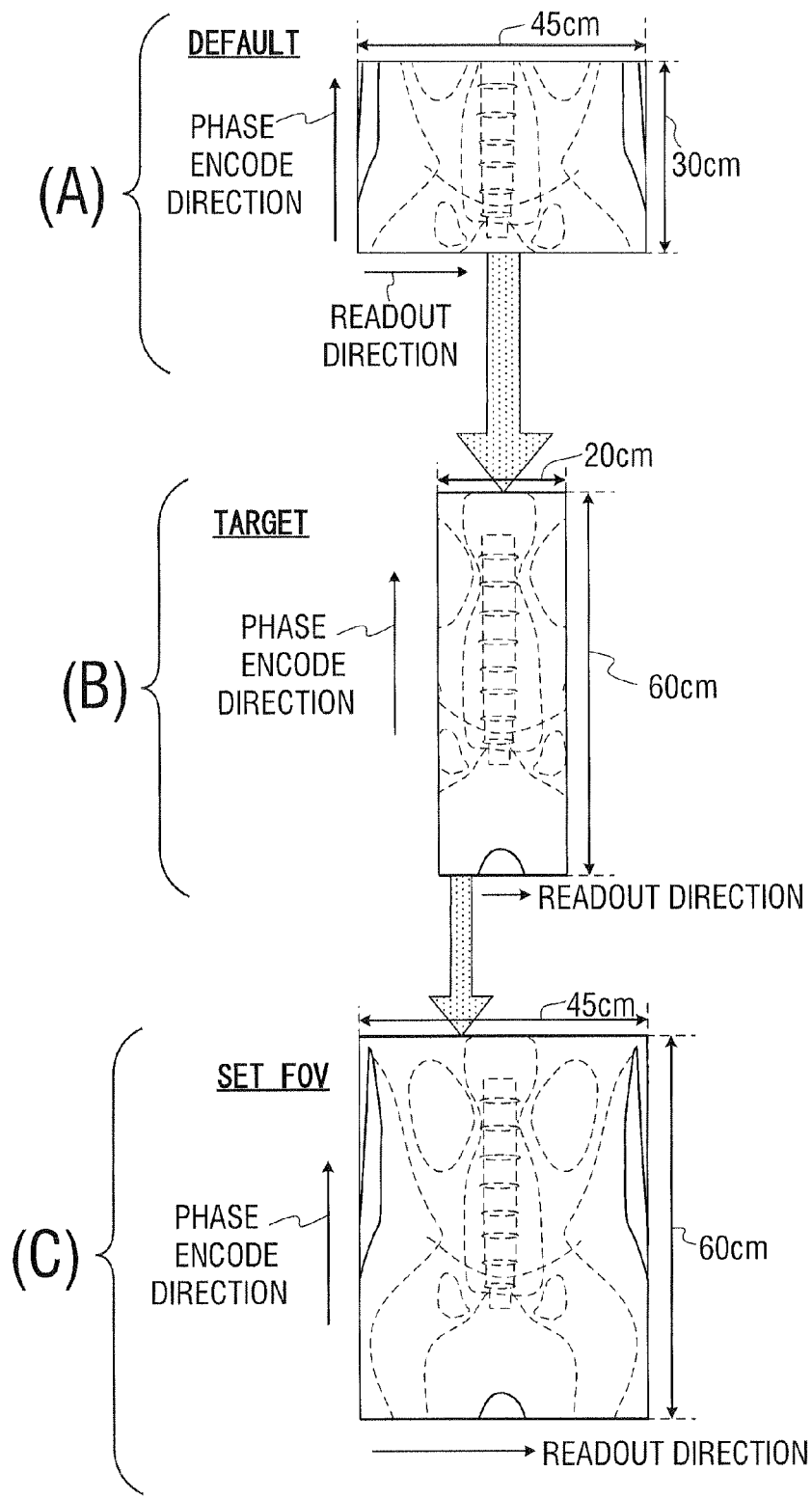
FIG. 8 is a schematic explanatory diagram showing another example of setting method of size of FOV.

FIG. 8 is a schematic explanatory diagram showing another example of setting method of size of FOV. FIG. 8 (A) similarly shows the initial setting value of FOV. Next, assume that a user sets FOV to 60 cm in the phase encode direction and 20 cm in the readout direction during the planning period of the imaging conditions of the main scan, for example. FIG. 8 (B) shows this state. In this case, the FOV size which is the minimum and satisfies the aforementioned two conditions is 60 cm in the phase encode direction and 45 cm in the readout direction. Thus, the calibration scan setting unit 100 sets the FOV of the calibration scan to the above values. FIG. 8 (C) shows this state.

Figure 9:
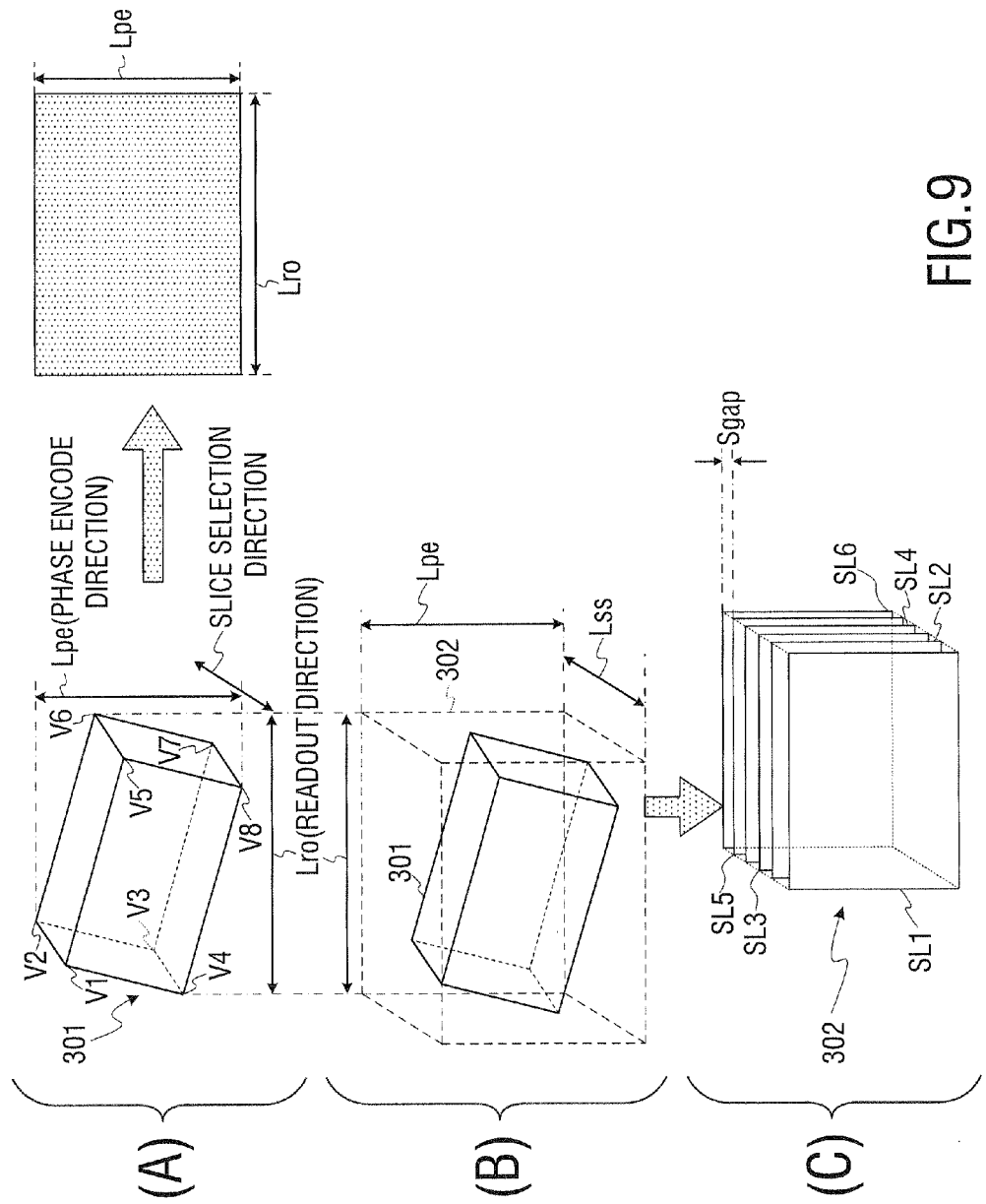
FIG. 9 is a schematic explanatory diagram showing an example of setting method of size of FOV in the case of three-dimensional imaging.

FIG. 9 is a schematic explanatory diagram showing an example of setting method of size of FOV in the case of three-dimensional imaging. Here, for simplicity of explanation, it is assumed that "each of the slice selection direction, the phase encode direction and the readout direction which are orthogonal to each other" accords with one of the X axis, the Y axis and the Z axis of the apparatus coordinate system.

Assume a case where a rectangular parallelepiped region whose (exterior) eight sides are in parallel with one of the three axes of the apparatus coordinate system is tilted from the three axes of the apparatus coordinate system, and this tilted region 301 is set as an imaging target in three-dimensional imaging by a user (see FIG. 9 (A)). In this case, the calibration scan setting unit 100 sets the minimum region as FOV 302 (see FIG. 9 (B)) so as to satisfy the following two conditions.

Firstly, each of the (exterior) eight sides of the minimum region are in parallel with one of the three axes of the apparatus coordinate system.

Secondly, the minimum region satisfies the two conditions which are the same as the case mentioned with FIG. 7.

In FIG. 9 (A), each vertex of the rectangular parallelepiped region 301 is defined as V1, V2, V3, V4, V5, V6, V7 and V8. In this example, out of the vertexes of the region 301, V4 and V6 are the most distant to each other in the readout direction. Thus, the distance in the readout direction between V4 and V6 is defined as Lro. Additionally, out of the vertexes of the region 301, V2 and V8 are the most distant to each other in the phase encode direction, and the distance in the phase encode direction between V2 and V8 is defined as Lpe.

If each of the distance Lro and the distance Lpe is not smaller than the initial setting value of FOV size (in the example of FIG. 7, it is 45 cm×30 cm) in the readout direction or the phase encode direction, the calibration scan setting unit 100 sets the size of a slice in the imaging region as a rectangular region whose two sides are the distance Lro and Lpe, respectively. FIG. 9 (A) shows this state.

Note that, when the distance Lro is smaller than the initial setting value of FOV size in the readout direction, the calibration scan setting unit 100 sets this initial setting value as a size in the readout direction for a slice in the imaging region. Additionally, when the distance Lpe is smaller than the initial setting value of FOV size in the phase encode direction, the calibration scan setting unit 100 sets this initial setting value as a size in the phase encode direction for a slice in the imaging region.

Next, the calibration scan setting unit 100 calculates "two vertexes (in this case, V1 and V7) which are the most distant to each other in the slice selection direction, out of all the vertexes of the region 301", in the way similar to the determination method of the distances Lro and Lpe. Then, the calibration scan setting unit 100 defines the distance between the two vertexes calculated above in the slice selection direction, as Lss.

Next, the calibration scan setting unit 100 sets a region satisfying the following two conditions as FOV 302.

The first condition is that the region (FOV 302) is a rectangular parallelepiped region whose width is Lro in the readout direction, Lpe in the phase encode direction and Lss in the slice selection direction, respectively.

The second condition is that the region (FOV 302) includes the region 301 as coordinate position of the apparatus coordinate system. FIG. 9 (B) shows this state.

Next, the calibration scan setting unit 100 sets slices SL1, SL2, SL3, SL4, SL5 and SL6 in the FOV 302 by evenly dividing the FOV 302. The slices SL1 to SL6 are set, in such a manner that (A) these slices are equally-spaced, (B) these slices are in parallel with each other, (C) each width in the readout direction of these slices is equally Lro, and (d) each width in the phase encode direction of these slices is equally Lpe.

FIG. 9 (C) shows this state. As just described, the calibration scan setting unit 100 makes the slice selection direction, the phase encode direction and the readout direction accord with each axis of the apparatus coordinate system, and keeps a plane of a slice in parallel with one of the X-Y plane, the Y-Z plane and the X-Z plane of the apparatus coordinate system.

Here, the setting method of the above slice interval (GAP) will be explained. As shown in FIG. 6, the slice interval Sgap is a parameter calculated based on imaging conditions of the main scan. The calibration scan setting unit 100 calculates the slice interval Sgap (see FIG. 9 (C)) by using the following equation (1).

$$Sgap = \{SSt - (Snu * Sth)\} / (Snu - 1) \quad (1)$$

In the equation (1), SSt is a width of FOV in the slice selection direction, and is Lss in the case of the FOV 302 in FIG. 9. Additionally, Snu is a number of slices. Sth is thickness of each slice. For example, if the width of FOV in the slice selection direction is 30 cm, the thickness of each slice is 1 cm and the slice number is 6, the slice interval Sgap is calculated as 4.8 cm by the equation (1).

As to other parameters calculated based on some or many of the imaging conditions of the main scan, the calibration scan setting unit 100 preliminarily stores calculation methods (determination methods) of respective parameter values or respective parameter conditions, and automatically sets conditions of those parameters based on the calculation methods (determination methods). The above "preliminarily" operation means, for example, that it occurs before power activation of the MRI apparatus 20, and the calculation methods may be stored before product shipment of the MRI apparatus 20.

Figure 10:
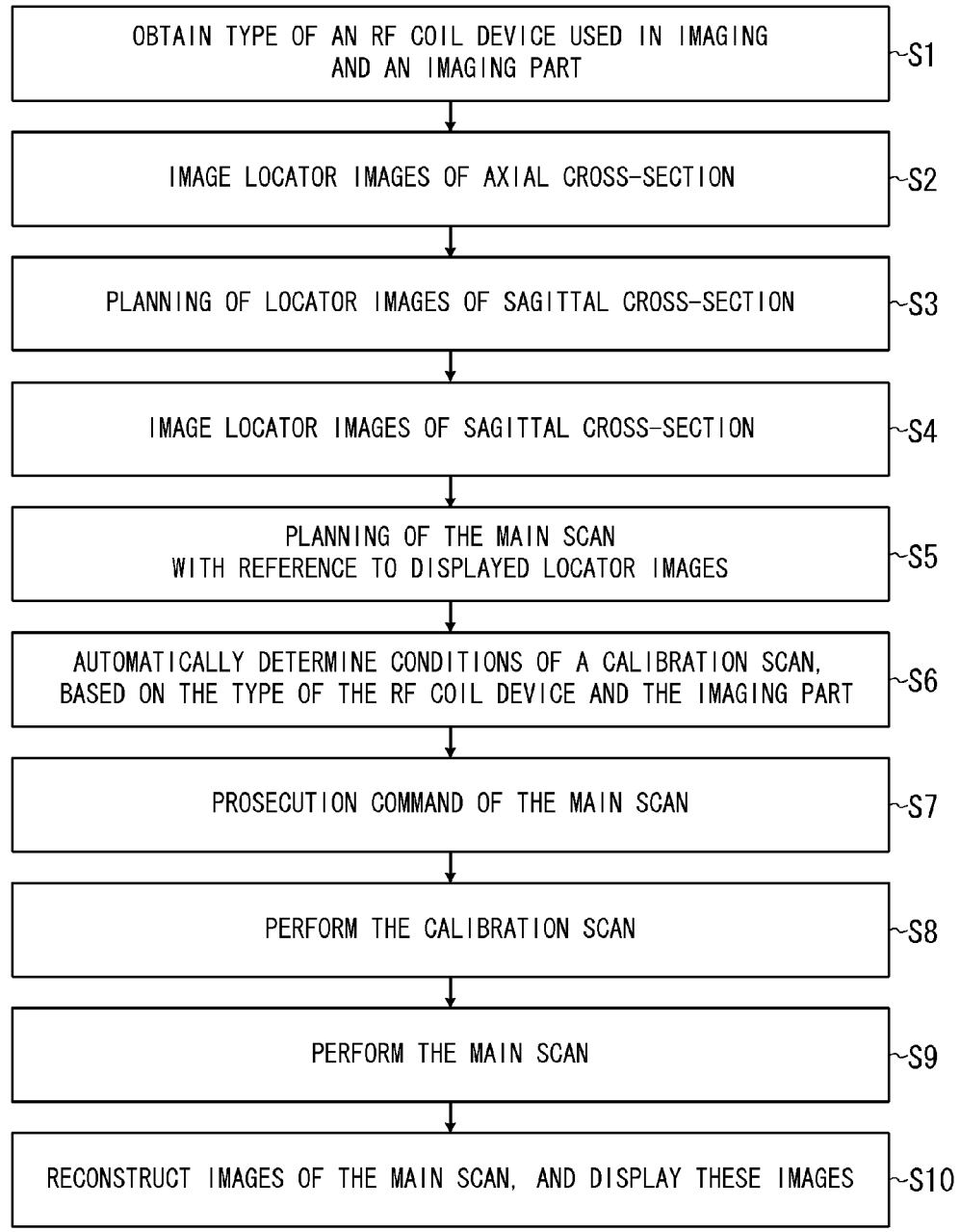
FIG. 10 is a flowchart illustrating a flow of a process performed by the MRI apparatus of the first embodiment.

FIG. 10 is a flowchart illustrating a flow of a process performed by the MRI apparatus 20 of the first embodiment. In the first embodiment, the conditions of calibration scans are automatically set based on some of the (previously set) imaging conditions of the main scan, and the calibration scans are executed before the main scan. In the following, according to the step numbers in the flowchart shown in FIG. 10, an operation of the MRI apparatus 20 will be described by referring to the aforementioned FIG. 1 to FIG. 9 as required.

[Step S1] The MPU 86 (see FIG. 2) performs initial setting of the MRI apparatus 20 based on some of the imaging conditions of the main scan inputted to the MRI apparatus 20 via the input device 62, and obtains the imaging part of the object P.

Additionally, when an RF coil device for detecting MR signals set on the object P is connected to the connection port of the MRI apparatus 20, the MPU 86 obtains the identification information of the RF coil device via the connection port and the sequence controller 56. Here, the number of RF coil device is not limited to one, it is plural in some cases. Additionally, the center frequency of RF pulses and the like are provisionally set by a prescan and so on.

Additionally, if selection of the coil elements is necessary (for example, if a nonlocal RF coil device is set on the object P), one or a plurality of coil elements used for reception of MR signals is (are) automatically or manually selected out of many coil elements of the RF coil device after execution of the aforementioned coil position measuring sequence, for example.

[Step S2] Under the control of the MPU 86, the table 32*a* on which the object P is set is moved to a predetermined position in the imaging space in the gantry, and locator images of the axial cross-section are imaged by the MRI apparatus 20. Note that, a locator image is a criterion image (reference image) for positioning.

Additionally, the above axial cross-section is defined by the patient coordinate system. In the present embodiment, as an example, the X axis, the Y axis and the Z axis of the patient coordinate system are defined as follows. That is, horizontal (left-right) direction of the object P is defined as the X axis direction. And front-to-rear direction of the object P is defined as the Y axis direction, assuming that the abdominal side is the front and the back side is the rear. And topside-to-downside direction of the object P is defined as the Z axis direction, assuming that the head side is topside and foot side is downside along the direction of a straight-line approximation of the backbone.

Additionally, an X-Y plane of the patient coordinate system is defined as an axial plane, an X-Z plane of the patient coordinate system is defined as a coronal plane, a Y-Z plane of the patient coordinate system is defined as a sagittal plane.

Note that, for simplicity of explanation, it is assumed here that the X axis, the Y axis and the Z axis of the patient coordinate system respectively accord with the X axis, the Y axis and the Z axis of the apparatus coordinate system, and the object P is set on the table 32*a* in such a manner that the body axis (straight-line approximation of the backbone) accords with the Z axis of the apparatus coordinate system.

The imaging operation of locator images is, for example, as follows.

First, a static magnetic field is formed in the imaging space by the static magnetic field magnet 22 excited by the static magnetic field power supply 40. Additionally, the sequence controller 56 drives the gradient magnetic field power supply 44, the RF transmitter 46 and the RF receiver 48 according to the pulse sequence inputted from the MPU 86, thereby a gradient magnetic field is formed in the imaging region, and RF signals are generated from the RF coil 28. In this time, the value provisionally set in the step 1 is used as the center frequency value of the RF pulse.

Then, MR signals generated by nuclear magnetic resonance inside the object P are received by the reception RF coil 28 and detected by the RF receiver 48. The RF receiver 48 performs predetermined signal processing on the detected MR signals and then performs A/D conversion on the MR signals to generate raw data, which are digitized complex number data of the MR signals. The RF receiver 48 inputs the generated raw data to the sequence controller 56.

The sequence controller 56 inputs the raw data to the image reconstruction unit 90.

The image reconstruction unit 90 arranges the raw data in the k-space formed in the k-space database 92 as k-space data and stores them.

The image reconstruction unit 90 obtains the k-space data from the k-space database 92 and reconstructs image data by performing image reconstruction processing including Fourier transformation on the obtained k-space data. The image reconstruction unit 90 stores the reconstructed image data in the image database 94.

The image processing unit 96 obtains the image data from the image database 94 and generates image data for two-dimensional display by performing predetermined image processing on the obtained image data. The image processing unit 96 stores the image data for two-dimensional display in the storage device 66.

[Step S3] A window for setting imaging conditions of locator images of the sagittal cross-section is displayed on the display device 64. A user sets the imaging conditions of locator images of the sagittal cross-section via the input device 62, refereeing to the setting window on the display device 64. The imaging conditions set here includes a condition as to which position of the sagittal cross-section is imaged with what size in relation to the already imaged axial cross-section, a condition as to how long the repetition time is set, and so on.

[Step S4] Under the control of the MPU 86, the table 32*a* on which the object P is set is moved to the predetermined position in the imaging space in the gantry, and imaging of the locator images of the sagittal cross-section is performed by the MRI apparatus 20 in the way similar to the aforementioned manner. The imaging conditions used for the above imaging of the locator images of the sagittal cross-section are the conditions planned in the step S3, i.e. conditions set by a user.

[Step S5] The display control unit 98 obtains display image data of the locator images of the axial cross-section and the sagittal cross-section from the storage device 66 according to the command from the MPU 86. The display control unit 98 displays the obtained display image data on the display device 64 as locator images. Additionally, the display control unit 98 makes the display device 64 display a window for setting the imaging conditions of the main scan. After this, a user sets the imaging conditions of the main scan via the input device 62, refereeing to the displayed locator images.

If the setting of the imaging conditions of the main scan has been finished, the MPU 86 brings forward the process to the next step S6. That is, unless a user finishes planning of the main scan (setting of the imaging conditions), the MPU 86 does not brings forward the process to the next step S6 in which conditions of calibration scan are automatically set.

[Step S6] The calibration scan setting unit 100 obtains the imaging part obtained by the MPU 86 in the step S1 and the identification information (type) of RF coil device(s) from the MPU 86. Then, the calibration scan setting unit 100 automatically selects (a) sequence(s) to be performed as the calibration scan based on some of the imaging conditions of the main scan, before calculation and automatic setting of conditions of the calibration scan.

More specifically, the calibration scan setting unit 100 preliminarily stores a plurality of sequences such as a sequence of generating the sensitivity distribution map of respective coil elements inside an RF coil device, the magnetic field measuring sequence of calculating an offset magnetic field to correct a static magnetic field, a sequence of calculating (a corrected value of) the center frequency of RF pulses and so on as candidates for the calibration scan. For example, the calibration scan setting unit 100 automatically selects which sequence(s) of those candidates is(are) performed as the calibration scan, in the following manner.

For example, if the pulse sequence of the main scan is parallel imaging, the calibration scan setting unit 100 sets the sequence of generating the sensitivity distribution map of each coil element inside an RF coil device as a calibration scan which is performed. Note that, the parallel imaging is a fast imaging technology to form RF coils by using a phased array coil including a plurality of coil elements and acquire MR signals with each of those coil elements. In the parallel imaging, generally, the number of data acquisition times in the phase encode direction is reduced, and wraparound artifact caused by decreasing (thinning out) the number of the phase encode steps is compensated by using the sensitivity distribution map obtained by a prescan.

On the contrary, if an RF coil device unsuitable for parallel imaging, for example, like a local RF coil device such as an RF coil device for the shoulder is used for reception of MR signals, the calibration scan setting unit 100 sets so that the sequence of generating the sensitivity distribution map is not performed as a calibration scan.

Additionally, for example, when accuracy of uniformity of the static magnetic field is especially desired or uniformity of the static magnetic field is highly impaired, the calibration scan setting unit 100 sets the magnetic field measuring sequence of calculating the offset magnetic field to correct the static magnetic field as a calibration scan which is performed.

For example, when an imaging station is moved by the movement of the table 32a like the multi-station imaging in the after-mentioned second embodiment, uniformity of the static magnetic field is impaired.

A case where accuracy of uniformity of the static magnetic field is especially desired is, for example, a case where local shimming (see Japanese Publication of Patent Application No. 2007-209749) is desired in cardiac imaging, or a case where fat-suppression is performed.

Additionally, for example, when many main scans are repeated on the same part of the object P without movement of the table 32a, the static magnetic field of the main scans from the second time can be corrected by using the offset magnetic field obtained in the calibration scan which is performed before the first main scan, without performing the sequence of calculating the offset magnetic field again.

In the above case, the calibration scan setting unit 100 deselects the magnetic field measuring sequence for calculating the offset magnetic field as a calibration scan after the first main scan.

Additionally, in the case of breast imaging, for example, a fat-suppression prepulse is included in a pulse sequence of the main scan in some cases because many of fat tissues are included in the imaging region. When a fat-suppression prepulse is included in the main scan, the calibration scan setting unit 100 selects the sequence of calculating a corrected value of the center frequency of RF pulses as a calibration scan which is performed.

Additionally, for example, when application of a prepulse suppressing MR signals from fat tissues is not included in a pulse sequence of the main scan, the calibration scan setting unit 100 deselects the sequence of calculating a corrected value of the center frequency of RF pulses as a calibration scan (i.e. this sequence is not performed).

Note that, the aforementioned guidelines as to which sequence should be performed as the calibration scan are only examples. For example, the aforementioned magnetic field measuring sequence of calculating the offset magnetic field and the sequence of calculating a corrected value of the center frequency of RF pulses may be set to be performed as the calibration scans, regardless of the imaging conditions of the main scan.

Next, the calibration scan setting unit 100 automatically calculates and automatically sets conditions (parameters) of each sequence which is determined to be performed as the calibration scan. More specifically, the calibration scan setting unit 100 classifies conditions (parameters) of each sequence into three types like FIG. 6, regardless of combination of the imaging part and the type of RF coil device(s).

Then, as to parameters to which contents of corresponding imaging conditions of the main scan are applied without modification such as 'Selected Coils', the calibration scan setting unit 100 sets them in that manner (i.e. the calibration scan setting unit 100 incorporates corresponding conditions of the main scan into these parameters).

Additionally, as to parameters fixedly calculated regardless of the imaging conditions of the main scan, the calibration scan setting unit 100 automatically sets these parameters based on the table data depending on the imaging part and the type of RF coil device(s).

Additionally, as to parameters calculated (determined) based on some of the imaging conditions of the main scan such as a slice interval (GAP), the calibration scan setting unit 100 automatically sets these parameters based on the preliminarily stored calculation method (determination method). As to method of calculation and automatic setting of conditions of each sequence of the calibration scans by the calibration scan setting unit 100, it is explained by using FIG. 6 to FIG. 9, and overlapping explanation is abbreviated.

Note that, when the sequence of calculating a corrected value of the center frequency of RF pulses is performed as the calibration scan, the calibration scan setting unit 100 sets conditions of this sequence in a method different from the aforementioned method. As to this sequence, to determine a region where magnetic resonance spectroscopy is performed is a main condition. This is because it is unnecessary for this sequence to set many parameters like the magnetic field measuring sequence of calculating the offset magnetic field or the sequence of generating the sensitivity distribution map.

In this case, the calibration scan setting unit 100 automatically sets the target region of the magnetic resonance spectroscopy to a slice including the center of 'the imaging region which is set in the sequence of calculating the offset magnetic field'.

Note that, calculation and automatic setting of conditions of the calibration scans by the calibration scan setting unit 100 is computing inside the MRI apparatus 20, and thus processing of this step S6 finishes instantly. Then, the process proceeds to the next step S7.

[Step S7] A start command of the main scan is inputted by a user via the input device 62. Until the start command of the main scan is inputted, the MPU 86 is on standby and does not go on to the next step.

[Step S8] After receiving the start command of the main scan, the MPU 86 makes the MRI apparatus 20 perform the calibration scan(s) whose conditions are automatically set in the step S6. Here, as an example, the aforementioned sequence of generating the sensitivity distribution map, the aforementioned magnetic field measuring sequence of calculating the offset magnetic field and the aforementioned sequence of calculating a corrected value of the center frequency of RF pulses are executed as three calibration scans.

Each sequence of the calibration scans is separately performed in terms of time. In this regard, it is preferable to perform the magnetic field measuring sequence of calculating the offset magnetic field prior to the sequence of calculating a corrected value of the center frequency of RF pulses. This is because more precise magnetic resonance spectrum data can be obtained by performing the sequence of calculating a corrected value of the center frequency of RF pulses under the state where the static magnetic field is corrected to become more uniform based on the offset magnetic field.

Similarly, it is preferable to perform the magnetic field measuring sequence of calculating the offset magnetic field prior to the sequence of generating the sensitivity distribution map. This is because more precise sensitivity distribution map can be obtained by performing the sequence of generating the sensitivity distribution map under the state where the static magnetic field is corrected to become more uniform based on the offset magnetic field, when uniformity of the static magnetic field is impaired depending on the imaging part and the size of the object.

Here, as an example, those three calibration scans are performed in order of firstly the magnetic field measuring sequence of calculating the offset magnetic field, secondly the sequence of calculating a corrected value of the center frequency of RF pulses, and thirdly the sequence of generating the sensitivity distribution map. Hereinafter, contents of these sequences will be explained.

Firstly, the magnetic field measuring sequence for calculating the offset magnetic field will be explained. This technology is explained, for example, in Patent Document 1 (Japanese Publication of Patent Application No. 2011-152348), and thus it is briefly explained here.

The bed controlling device 50 moves the table 32a on which the object is set into the inside of the gantry according to the control by the MPU 86 and the sequence controller 56. Additionally, electric current is supplied from the static magnetic field power supply 40 to the static magnetic field magnet 22 under the control of the sequence controller 56, and thereby the static magnetic field is formed in the imaging space. The above electric current value is a value controlled so as to form a uniform static magnetic field if nothing exists in the imaging space, and the static magnetic field formed by this electric current is defined as a criterion static magnetic field. Because there is a region whose magnetic permeability is different from its surrounding regions in the imaging space due to the existence of the object P, actual intensity distribution of the static magnetic field becomes non-uniform.

Next, the sequence controller 56 selects a slice by applying the gradient magnetic fields (Gx, Gy and Gz) so as to obtain intensity distribution of the magnetic field of the imaging space, and transmits RF pulses and so on based on control signals from the MPU 86. After this, MR signals are detected by the RF receiver 48, and the detected MR signals are inputted to the MPU 86 via the sequence controller 56.

Because these MR signals are raw data in the k-space (frequency space), the MPU 86 transforms the inputted MR signals into real-space data in the X-Y-Z coordinate system, calculates intensity distribution of the magnetic field of the imaging space based on the real-space data, and defines this intensity distribution as "a measured magnetic field intensity distribution Bm(x, y, z)". This (x, y, z) means a function of coordinate position (x, y, z) in the apparatus coordinate system.

After this, the MPU 86 calculates "intensity distribution Bo(x, y, z) of the offset magnetic field" which uniformizes the static magnetic field, by using, for example, the following equation (2).

$$Bo(x,y,z)=Bi(x,y,z)-Bm(x,y,z) \qquad (2)$$

In the equation (2), Bi(x, y, z) is a target intensity distribution of the static magnetic field and is a uniform distribution over the entire imaging space. That is, the measured magnetic field intensity distribution Bm(x, y, z) is generated if the offset magnetic field is not applied. However, in the main scan, it is controlled so that the offset magnetic field is superimposed on the criterion static magnetic field, and thereby approximately the target intensity distribution of the static magnetic field is obtained.

Secondly, an example of the sequence of calculating a corrected value of the center frequency of RF pulses will be explained. For example, the same conditions as the magnetic field measuring sequence are used for the conditions of this calibration scan, except that magnetic resonance spectroscopy is performed on a slice including the center of FOV. The MPU 86 acquires and analyzes frequency spectrums obtained by magnetic resonance spectroscopy performed on the slice including the center of FOV by controlling each component of the MRI apparatus 20. Thereby, the MPU 86 detects a magnetic resonance frequency of nuclear spin of hydrogen atoms based on a peak frequency and the like.

The MPU 86 calculates and corrects(sets again) the center frequency of RF pulses used for the main scan, based on the execution result of the above sequence. More specifically, for example, the detected magnetic resonance frequency of nuclear spin of hydrogen atoms is set as the center frequency of the RF pulses. Note that, as to the sequence of detecting the center frequency and the like, for example, a conventional technology such as the technology described in Patent Document 3 (Japanese Publication of Patent Application No. 2009-34152) may be used.

Thirdly, an example of the sequence of generating the sensitivity distribution map of a (wearable) RF coil device will be explained. This technology is explained, for example, in Patent Document 2 (Japanese Publication of Patent Application No. 2005-237703), and thus it is briefly explained here.

Firstly, the sequence of generating the sensitivity distribution map is inputted from the MPU 86 to the sequence controller 56, and MR signals are acquired by using the RF coil device set on the object P and the whole body coil WB for detecting MR signals. Then, image data obtained from the whole body coil WB (hereinafter, referred to as WB image data) and image data obtained from the RF coil device (hereinafter, referred to as main coil image data) are obtained as image data for estimating the sensitivity distribution of all the coil elements in the RF coil device, and are stored in the image database 94. Similar acquisition of image data are performed over respective cross-sections of the entire three-dimensional region, and thereby acquired data are stored as volume data in the image database 94.

The MPU 86 generates (calculates) the sensitivity distribution of all the coil elements included in the RF coil device as three-dimensional sensitivity distribution map data based on the execution result of the above sequence of generating the sensitivity distribution map, and stores the generated data in the storage device 66.

More specifically, for example, the signal intensity distribution of the main coil image data is divided by the signal intensity distribution of the WB image data, and their intensity ratio is calculated as an estimation value of the sensitivity distribution of all the coil elements in the RF coil device. By performing similar processing on image data of each cross-section of the entire three-dimensional region, three-dimensional sensitivity distribution map data can be generated. The three-dimensional sensitivity distribution map data are used for luminance correction processing after reconstruction of image data by the image reconstruction unit 90, for example.

Note that, the sensitivity distribution map can be generated by using only the RF coil device set on the object P for reception, without using the whole body coil WB for reception. This is because the WB image data obtained from the whole body coil WB are used as criterion.

The MPU 86 determines undetermined conditions out of the imaging conditions of the main scan, based on the execution results of the calibration scans. When the magnetic field measuring sequence is performed as the calibration scan, the above undetermined conditions includes, for example, a condition indicating intensity distribution of a magnetic field which is superimposed on the criterion static magnetic field in order to uniformize the static magnetic field during the implementation term of the main scan and the like. Additionally, when the sequence of calculating the corrected value of the center frequency of RF pulses is performed as the calibration scan, the above undetermined conditions includes, for example, the center frequency value of RF pulses during the implementation term of the main scan.

[Step S9] The MRI apparatus 20 performs the main scan under the control of the MPU 86. The MRI apparatus 20 applies a uniformized static magnetic field by superimposing the offset magnetic field on the criterion static magnetic field. As to the quadratic components of the offset magnetic field, for example, the MPU 86 adjusts electric current supplied to the shim coil 24 by controlling the shim coil power supply 42, and thereby the quadratic components is corrected. Additionally, As to the linear components of the offset magnetic field, for example, the MPU 86 adjusts electric currents respectively supplied to the gradient magnetic field coil 26*x*, the gradient magnetic field coil 26*y* and the gradient magnetic field coil 26*z* by controlling the gradient magnetic field power supply 44, and thereby the linear components is corrected.

Under application of the static magnetic field uniformized in the above manner, acquisition of MR signals for the main scan is performed. That is, the MPU 86 controls each component of the MRI apparatus 20 in the same way as the imaging operation of locator images, thereby gradient magnetic fields are formed in the imaging region including the imaging part of the object P and an RF pulse with the corrected center frequency is transmitted from the RF coil 28. The MR signals generated by the above operation are detected by the RF coil device, received by the RF receiver 48, transformed into the raw data, and inputted to the image reconstruction unit 90. The image reconstruction unit 90 arranges and stores the raw data of MR signals in the k-space formed in the k-space database 92, as k-space data.

[Step S10] The image reconstruction unit 90 obtains the k-space data from the k-space database 92 and reconstructs image data by performing image reconstruction processing including Fourier transformation on the obtained k-space data. The image reconstruction unit 90 stores the reconstructed image data in the image database 94.

The image processing unit 96 extracts corresponding parts from the three-dimensional sensitivity distribution map according to the imaging conditions of the main scan such as the direction of imaged cross-sections and image reconstruction conditions and so on, and uses the extracted data as the sensitivity distribution map.

The image processing unit 96 obtains the reconstructed image data from the image database 94, and performs luminance correction processing on the obtained image data by using the sensitivity distribution map. The image processing unit 96 stores the image data after luminance correction processing in the image database 94. Note that, the above luminance correction processing is an example of correction processing for reconstructed image data. Thereby, accidental error caused by sensitivity difference between respective coil elements in the RF coil device is ameliorated.

The image processing unit 96 generates image data for two-dimensional display by performing predetermined image processing on the corrected image data. The image processing unit 96 stores the image data for two-dimensional display in the storage device 66. Note that, if the sequence of generating the sensitivity distribution map is not included in the calibration scans, the above luminance correction processing is not performed.

Then, the image data for two-dimensional display are transmitted to the display control unit 98 under the command of the MPU 86, and they are displayed on the display device 64 as images. The foregoing is a description of an operation of the MRI apparatus 20 according to the present embodiment.

As just described, according to the MRI apparatus 20 of the present embodiment, the calibration scan setting unit 100 automatically sets which sequence(s) is(are) performed as a calibration scan, based on some of the (already determined) imaging conditions of the main scan (see the step S6).

Next, the calibration scan setting unit 100 classifies conditions of each sequence as the calibration scan into the three types, and automatically sets the conditions of the calibration scan(s) according to the combination of the imaging part and the type of a wearable RF coil device for detecting MR signals.

For example, when a fat-suppression prepulse is included in the main scan, the sequence of calculating the corrected value of the center frequency of RF pulses is performed as the calibration scan. In this manner, desired sequence(s) depending on the imaging conditions of the main scan is (are) automatically executed as the calibration scan. In the above example, the effect of suppressing MR signals from fat tissues is ensured. Thus, manipulation by a user is not needed, thereby handleability of the MRI apparatus 20 is improved, and effect of improving image quality of the main scan can be expected.

Additionally, for example, the following image degradation caused by operation mistake of a user can be avoided. That is, image quality is degraded due to non-uniform fat-suppression effect, because a user forgot to insert the sequence of calculating a corrected value of the center frequency of RF pulses despite the main scan including a fat-suppression prepulse. Such a case can be avoided in the present embodiment.

Additionally, when the main scan involves parallel imaging or non-uniformity of luminance, image degradation such as wraparound artifact and non-uniformity of luminance is caused unless the sequence of generating the sensitivity distribution map of respective coil elements in the RF coil device is not performed. However, in the case of the main scan including parallel imaging and so on, the calibration scan setting unit 100 automatically selects(sets) the sequence of generating the sensitivity distribution map of respective coil elements in the RF coil device as a calibration scan to be performed, and the above image degradation can be avoided.

More specifically, in the case of performing the sequence of generating the sensitivity distribution map, the calibration scan setting unit 100 automatically classifies the conditions of this sequence into the aforementioned three types and automatically sets the conditions according to the combination of the imaging part and the type of the RF coil device.

As to this automatic setting, as previously mentioned with FIG. 6 to FIG. 9, the calibration scan setting unit 100 preliminarily stores table data and calculation (determination) methods which give an appropriate value or content to each condition depending on the imaging part and the type of the RF coil device. Thus, the sensitivity distribution map of the coil elements in the RF coil device can be precisely generated, and thereby luminance (sensitivity) correction is performed after image reconstruction for the main scan by using the sensitivity distribution map. Thus, image quality can be improved.

Similarly, as to the sequence of calculating the offset magnetic field, its conditions are classified into the three types depending on the imaging part and the type of the RF coil device, and each condition is set automatically and appropriately by using the preliminarily stored table data and calculation methods which give an appropriate value or content to each condition. Accordingly, MR signals in the main scan are acquired under the static magnetic field which is more uniformized by the precise offset magnetic field obtained in the above manner, and thus image quality is further improved.

On the other hand, in the conventional technology, conditions of calibration scans are automatically set in a uniform manner regardless of an imaging part and a type of an RF coil device, or conditions of calibration scans are manually set by a user. When conditions of calibration scans are automatically set in a uniform manner, conditions of a calibration scan are not necessarily set to appropriate values or contents, because the sensitivity distribution map is generated under the same conditions regardless of imaging conditions and the offset magnetic field is calculated under the same conditions. When conditions of calibration scans are manually set by a user, burden of manipulation is imposed on a user even if conditions of a calibration scan are appropriately set.

However, according to the aforementioned embodiment, conditions of calibration scans such as a prescan are appropriately set without manipulation by a user in MRI. Thus, the aforementioned conventional problem is resolved.

Note that, in the above embodiment, an example in which the magnetic field measuring sequence of calculating the offset magnetic field and the sequence of calculating a corrected value of the center frequency of RF pulses are separately performed as discrete calibration scans. This is only an example. The magnetic field measuring sequence and the sequence of calculating a corrected value of the center frequency of RF pulses may be performed as one (set of) calibration scan. This point applies to other subsequent embodiments and modified embodiments. That is, a set of processing in which a magnetic field is measured, magnetic resonance spectroscopy is performed under application of the static magnetic field corrected by the offset magnetic field calculated based on the result of the magnetic field measurement, and then the center frequency of RF pulse is corrected (set again) based on the obtained frequency spectrum data may be performed as one calibration scan.

Second Embodiment

The hardware components of the MRI apparatus of the second embodiment and the subsequent embodiments are the same as the MRI apparatus 20 of the first embodiment. In the second embodiment, automatic setting methods of conditions of calibration scans in multi-station imaging (i.e. imaging at each position of the table 32a by alternately repeating step movement of the table 32a and temporary stop) will be explained. Here, as an example, a case of three-station imaging where main scans are respectively performed at table positions of the first station to the third station will be explained.

Figure 11:
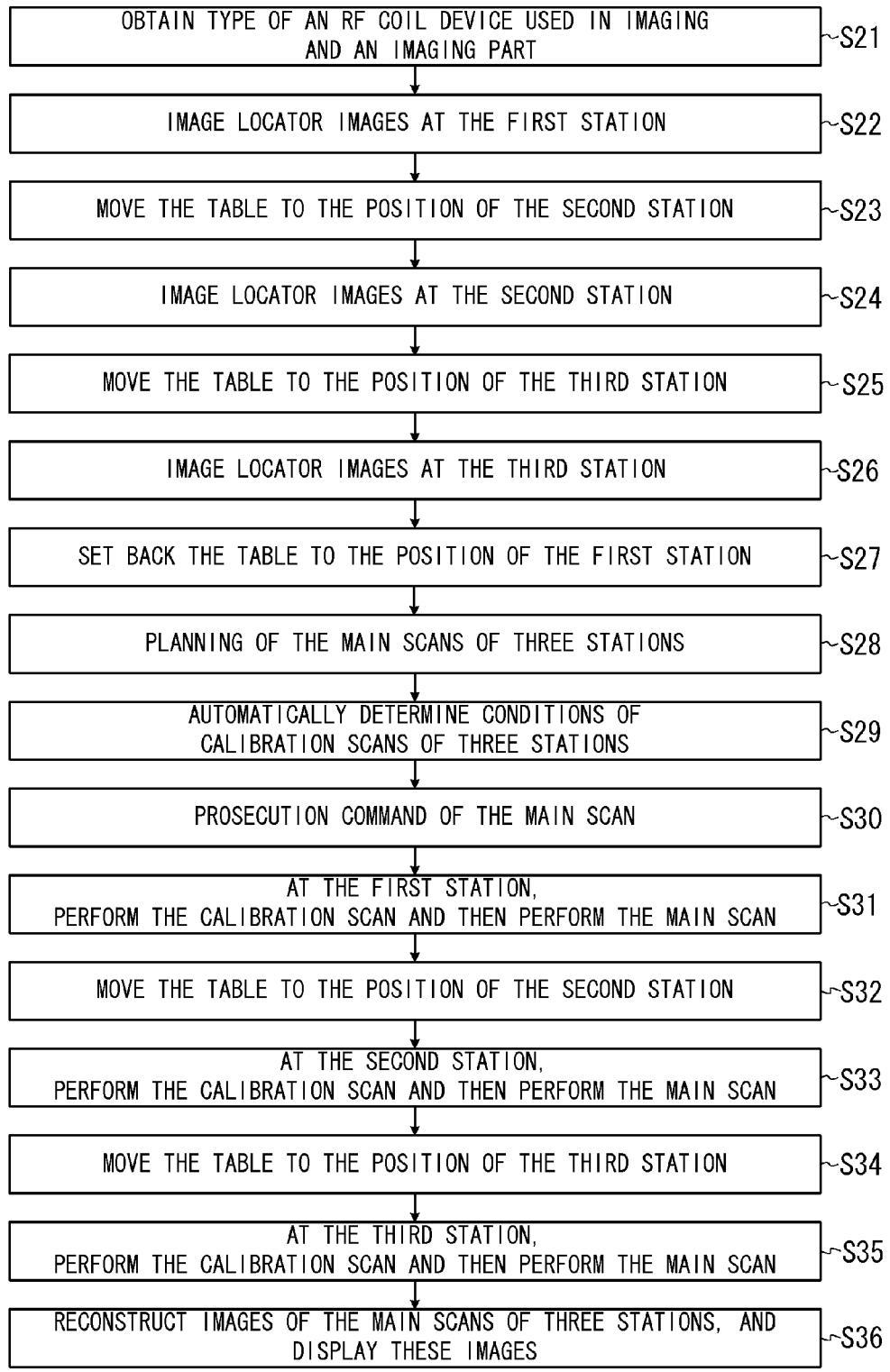
FIG. 11 is a flowchart illustrating a flow of a process performed by the MRI apparatus of the second embodiment.

FIG. 11 is a flowchart illustrating a flow of a process performed by the MRI apparatus 20 of the second embodiment. In the following, according to the step numbers in the flowchart shown in FIG. 11, an operation of the MRI apparatus 20 of the second embodiment will be described.

[Step S21] The MPU 86 performs initial setting of the MRI apparatus 20 in the way similar to the step S1 of the first embodiment, and obtains the imaging part of the object P and the identification information of RF coil device(s).

Because three station imaging is performed, one or plural RF coil device(s) for detecting MR signals covering a certain degree of range(broadness) like the RF coil device 140 for the upper half of the body is(are) used. Then, for example, after performing the aforementioned coil position measuring sequence, the coil elements used for detection of MR signals are selected per station out of the many coil elements in the RF coil device(s) automatically or manually.

[Step S22] The sequence controller 56 moves the table 32a on which the object P is set to the first predetermined position (the position of the first station) in the imaging space in the gantry, by driving the bed controlling device 50 under the command from the MPU 86. After this, the table 32a does not move until the process proceeds to the next step S23.

Next, under the control of the MPU 86, the MRI apparatus 20 images locator images at the position of the first station in the way similar to the step S2 to S4 in the first embodiment.

[Step S23] The sequence controller 56 moves "the table 32a on which the object P is set" to the second predetermined position (the position of the second station) in the imaging space, by driving the bed controlling device 50 under the command from the MPU 86. After this, the table 32a does not move until the process proceeds to the step 25.

[Step S24] Under the control of the MPU 86, the MRI apparatus 20 images locator images at the position of the second station in the aforementioned manner.

[Step S25] The sequence controller 56 moves "the table 32a on which the object P is set" to the third predetermined position (the position of the third station) in the imaging space, by driving the bed controlling device 50 under the command from the MPU 86. After this, the table 32a does not move until the process proceeds to the step 27.

[Step S26] Under the control of the MPU 86, the MRI apparatus 20 images locator images at the position of the third station in the aforementioned manner.

[Step S27] The sequence controller 56 moves the table 32a on which the object P is set to the position of the first station in the imaging space, by driving the bed controlling device 50 under the command from the MPU 86.

[Step S28] The display control unit 98 makes the display device 64 display the respective locator images of the first to third stations under the control of the MPU 86. After this, a user sets the imaging conditions of the main scans of the three stations via the input device 62, referring to the displayed locator images. When the (manual) setting of the imaging conditions of the main scans is finished, the MPU 86 brings forward the process to the next step S29. That is, if a user does not finish planning of the main scans, the process does not proceed to the next step.

[Step S29] The calibration scan setting unit 100 obtains the imaging part of the object P and the identification information of (an) RF coil device(s) from the MPU 86. Then, the calibration scan setting unit 100 automatically selects (a) sequence(s) performed as the calibration scan based on some of the imaging conditions of the main scans in the way similar to the step S6 in the first embodiment.

After this, the calibration scan setting unit 100 calculates and automatically sets conditions (parameters) of each sequence performed as the calibration scan in the way similar to the step S6. In this example, the calibration scan setting unit 100 calculates and automatically sets conditions of the calibration scans for the three stations.

[Step 30] A start command of the main scan is inputted by a user via the input device 62. Until the start command of the main scan is inputted, the MPU 86 is on standby and does not go on to the next step.

[Step S31] The table 32a has been moved to the position of the first station since the step S27. After receiving the start command of the main scan, the MPU 86 makes the MRI apparatus 20 perform "the calibration scan(s) whose conditions are automatically set in the step S29" at the position of the first station.

After this, the MPU 86 determines undetermined conditions out of the imaging conditions of the main scan at the position of the first station, based on the execution result of the calibration scan(s). The undetermined conditions includes, for example, the corrected value of the center frequency of RF pulses during the implementation term of the main scan, when the sequence of calculating the corrected value of the center frequency of RF pulses is performed as the calibration scan under application of a static magnetic field corrected by the aforementioned offset magnetic field.

As just described, after all the imaging conditions of the main scan at the position of the first station are determined, the MPU 86 makes the MRI apparatus 20 perform the main scan at the position of the first station, by controlling each component of the MRI apparatus 20. Thereby, MR signals acquired at the position of the first station are transformed into raw data, and arranged and stored in the k-space formed in the k-space database 92 as k-space data.

[Step S32] The sequence controller 56 moves "the table 32a on which the object P is set" to the position of the second station in the imaging space, by driving the bed controlling device 50 under the command from the MPU 86. After this, the table 32a does not move until the process proceeds to the step 34.

[Step S33] The MPU 86 makes the MRI apparatus 20 perform "the calibration scan(s) at the position of the second station. Then, the MPU 86 determines undetermined conditions out of the imaging conditions of the main scan at the position of the second station, based on the execution result of the calibration scan(s).

After this, the MPU 86 makes the MRI apparatus 20 perform the main scan at the position of the second station, by controlling each component of the MRI apparatus 20. Thereby, MR signals acquired at the position of the second station are transformed into raw data, and arranged and stored in the k-space formed in the k-space database 92 as k-space data.

[Step S34] The sequence controller 56 moves the table 32a on which the object P is set to the position of the third station in the imaging space, by driving the bed controlling device 50 under the command from the MPU 86.

[Step S35] The MPU 86 makes the MRI apparatus 20 perform the calibration scan(s) at the position of the third station. Then, the MPU 86 determines undetermined conditions out of the imaging conditions of the main scan at the position of the third station, based on the execution result of the calibration scan(s).

After this, the MPU 86 makes the MRI apparatus 20 perform the main scan at the position of the third station, by controlling each component of the MRI apparatus 20. Thereby, MR signals acquired at the position of the third station are transformed into raw data, and arranged and stored in the k-space formed in the k-space database 92 as k-space data.

[Step S36] The image reconstruction unit 90 reconstructs image data of the main scans of the three stations in the way similar to the step S10 in the first embodiment, and stores these image data in the image database 94.

The image processing unit 96 obtains the image data from the image database 94, performs luminance correction processing on the obtained image data by using the sensitivity distribution map in the same way as the aforementioned the step S10, and generates image data for two-dimensional display by performing predetermined image processing on the image data after luminance correction processing. The image processing unit 96 stores the image data for two-dimensional display in the storage device 66. Note that, if the sequence of generating the sensitivity distribution map is not included in the calibration scans, the above luminance correction processing is not performed.

Then the image data for two-dimensional display are transmitted to the display control unit 98 under the command of the MPU 86, and they are displayed on the display device 64 as images. The foregoing is a description of an operation of the MRI apparatus 20 according to the second embodiment.

As just described, according to the MRI apparatus 20 of the second embodiment, the same effects as the first embodiment are obtained. Moreover, in the second embodiment, conditions of the calibration scan can be set automatically and appropriately without imposing burden of setting manipulation on a user, in the case of multi-station imaging.

Note that, in the second embodiment, an example of three station imaging in which the number of step movement is three has been explained. The step movement is a set of movement of the table 32a and imaging. However, the embodiments of the present invention are not limited to such an implementation. The number of step movement (the number of stations) may be two or 4 or more than 4.

Additionally, the process may proceed to the next station by moving the table 32a after performing imaging of locator images and the main scan at each station in the following manner.

For example, a case of two stations will be explained. Firstly, locator images are imaged at the position of the first station, then planning of the main scan of the first station is performed, then conditions of the calibration scan(s) are automatically set, and then the calibration scan(s) is (are) performed. After this, all the imaging conditions of the main scan at the position of the first station are determined based on the execution result of the calibration scan(s), and the main scan is performed at the position of the first station. Next, the table 32a is moved to the position of the second station.

Next, locator images are imaged at the position of the second station, then planning of the main scan of the second station is performed, then conditions of the calibration scan(s) are automatically set, and then the calibration scan(s) is (are) performed. After this, all the imaging conditions of the main scan at the position of the second station are determined based on the execution result of the calibration scan(s), and the main scan is performed at the position of the second station.

Finally, image data of the main scans of all the stations are reconstructed and displayed as images.

Third Embodiment

The third embodiment aims to shorten imaging time in the case of performing a plurality of main scans. In the third embodiment, as an example, the first main scan and the second main scan are performed in series, the calibration scan(s) for the first main scan is(are) performed during a planning span for the imaging conditions of the second main scan by a user, and thereby shortening of imaging time is attempted. Here, as an example, it is assumed that the first main scan is a scan for which execution of only calibration scan(s) capable of executing after the main scan is desired (for example, renal artery imaging). However, this is only an example, and the first main scan may be another sequence.

Figure 12:
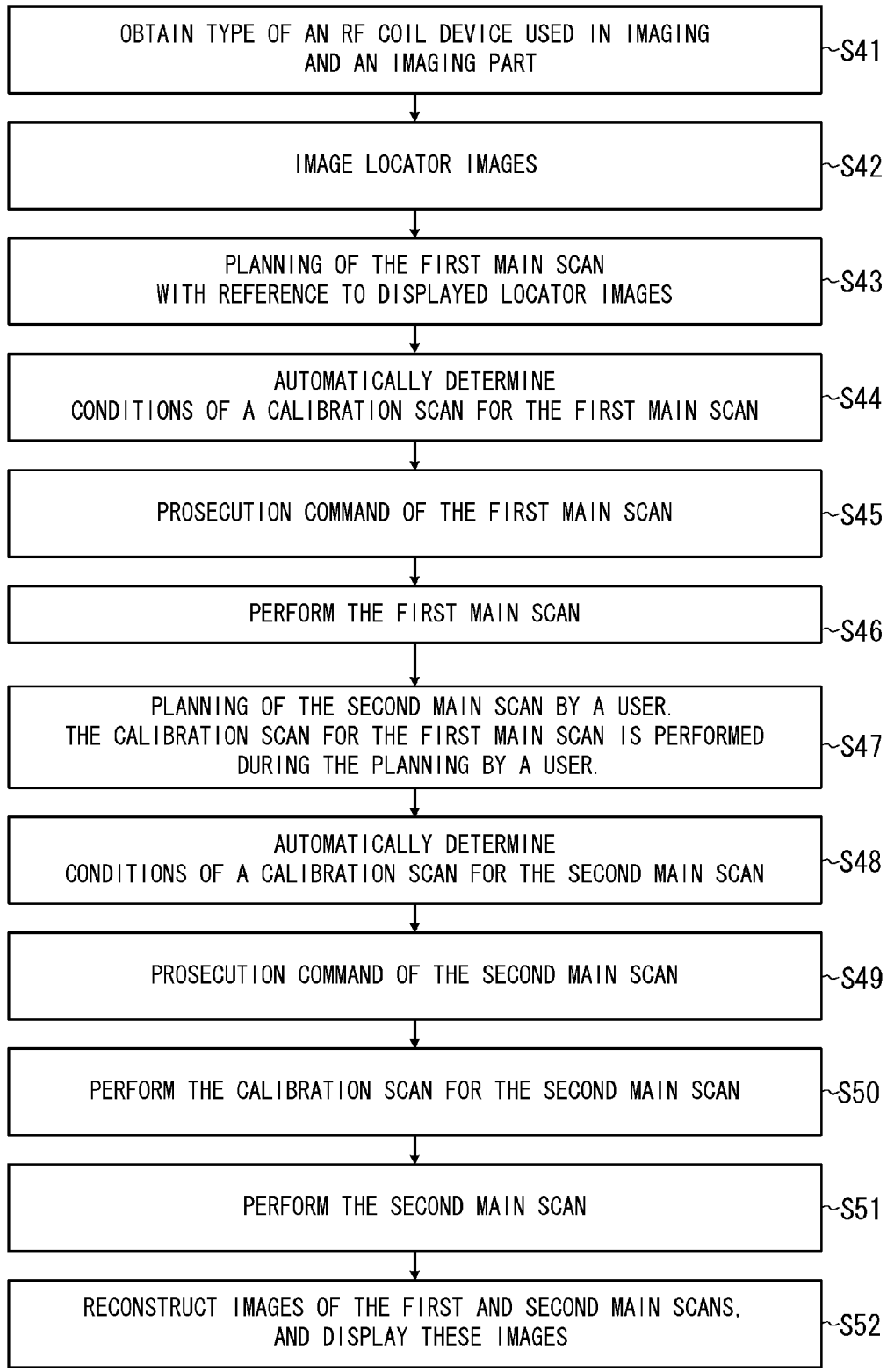
FIG. 12 is a flowchart illustrating a flow of a process performed by the MRI apparatus of the third embodiment.

FIG. 12 is a flowchart illustrating a flow of a process performed by the MRI apparatus 20 of the third embodiment. In the following, according to the step numbers in the flowchart shown in FIG. 12, an operation of the MRI apparatus 20 of the third embodiment will be described.

[Step S41] The MPU 86 performs initial setting of the MRI apparatus 20 in the way similar to the step S1 of the first embodiment, and obtains the imaging part of the object P and the identification information of (an) RF coil device(s). Additionally, the center frequency of RF pulses and the like are provisionally set by a prescan and so on.

Additionally, if selection of the coil elements is necessary, one or plurality of coil element(s) used for reception of MR signals is (are) automatically or manually selected out of many coil elements of the RF coil device(s) after execution of the aforementioned coil position measuring sequence, for example.

[Step S42] Locator images are imaged in the way similar to the step S2 and S3 of the first embodiment.

[Step S43] The locator images are displayed on the display device 64 in the way similar to the step S5 of the first embodiment. Setting (planning) of the imaging conditions of the first main scan is performed by a user referring to the displayed locator images.

[Step S44] The calibration scan setting unit 100 obtains the imaging part of the object P and the identification information of the RF coil device(s) acquired by the MPU 86 in the step S41.

Then, the calibration scan setting unit 100 automatically selects (a) sequence(s) performed as "the calibration scan for the first main scan" based on the imaging conditions of the first main scan in the way similar to the step S6 in the first embodiment.

Here, as an example, it is assumed that only the sequence(s) capable of being performed after the main scan such as the sequence of generating the sensitivity distribution map is(are) selected. That is, it is assumed that the imaging conditions of the first main scan do not require correction of the static magnetic field before performance of the first main scan.

Next, the calibration scan setting unit 100 automatically calculates and automatically sets conditions of each sequence performed as the calibration scan for the first main scan in the way similar to the step S6 in the first embodiment.

[Step S45] A start command of the first main scan is inputted by a user via the input device 62. Until the start command of the first main scan is inputted, the MPU 86 is on standby and does not go on to the next step.

[Step S46] The first main scan is performed in the way similar to the step S9 in the first embodiment.

[Step S47] For example, images obtained in the step S42 are displayed as locator images on the display device 64, setting (planning) of the imaging conditions of the second main scan is performed by a user referring to the displayed images.

During the planning span of the imaging conditions of the second main scan by a user, the MPU 86 makes the MRI apparatus 20 perform the calibration scan(s) for the first main scan whose conditions are automatically set in the step S44, by controlling each component of the MRI apparatus 20.

The span during which planning is performed by a user is, in other words, a period during which the imaging conditions of the second main scan are being set for the MPU 86 via the input device 62.

When both of the planning of the imaging conditions of the second main scan and the calibration scan(s) for the first main scan are finished, the MPU 86 brings forward the process to the next step.

[Step S48] The calibration scan setting unit 100 automatically selects (a) sequence(s) performed as the calibration scan for the second main scan based on the imaging conditions of the second main scan in the way similar to the aforementioned manner.

Next, the calibration scan setting unit 100 calculates and automatically sets conditions of each sequence performed as the calibration scan for the second main scan in the way similar to the aforementioned manner.

[Step S49] A start command of the second main scan is inputted by a user via the input device 62. Until the start command of the second main scan is inputted, the MPU 86 is on standby and does not go on to the next step.

[Step S50] The MPU 86 makes the MRI apparatus 20 perform the calibration scan(s) for the second main scan whose conditions are automatically set in the step S48, by controlling each component of the MRI apparatus 20. When the calibration scan(s) for the second main scan include(s) a sequence which should be performed before the main scan like the magnetic field measuring sequence, the MPU 86 determines (modifies) some of the imaging conditions of the second main scan in such a manner that the execution result of this calibration scan is reflected.

[Step S51] The second main scan is performed in the way similar to the step S9 in the first embodiment.

[Step S52] Images are reconstructed based on MR signals acquired in the first main scan and the second main scan in the way similar to the step S10 in the first embodiment, and these images are displayed on the display device 64. Note that, as correction processing for image data reconstructed based on MR signals acquired in the first main scan, luminance correction processing is also performed by using the sensitivity distribution map obtained in the calibration scan for the first main scan. The foregoing is a description of an operation of the MRI apparatus 20 according to the third embodiment.

As just described, according to the MRI apparatus 20 of the third embodiment, the same effects as the first embodiment are obtained. The third embodiment is effective for a case where the calibration scan(s) for a main scan performed anterior to another main scan include(s) only sequence(s) capable of being performed after the corresponding main scan. This is because the calibration scan(s) for the executed main scan can be automatically executed during a planning span of imaging conditions of the following main scan by a user. Thereby, imaging time can be shortened.

As a sequence of the calibration scan which can be performed after the corresponding main scan as well as before the corresponding main scan, there are the following sequence aside from the sequence of generating the sensitivity distribution map used as an example in the third embodiment. For example, when the sequence of the main scan is EPI (Echo Planar Imaging), a sequence of obtaining phase correction data of EPI can be performed after the main scan as well as before the main scan. This is because the phase correction of EPI may be performed after the main scan (for example, after reconstruction of image data).

Additionally, in the third embodiment, an example in which only the sequence capable of being performed after the main scan is selected as the calibration scan for the first main scan has been explained. However, there is a possibility that a sequence which should be performed before the main scan is selected as the calibration scan, depending on the imaging conditions of the first main scan.

When a sequence which should be performed before the main scan like the aforementioned magnetic field measuring sequence is selected, the MPU 86 may appropriately change the execution order (of main scans and calibration scans) in such a manner that the calibration scan for the first main scan is executed just before the execution of the first main scan. This point applies to the next fourth embodiment.

Fourth Embodiment

In the fourth embodiment, an example of multi-station imaging to which the method of the third embodiment is applied will be explained.

Figure 13:
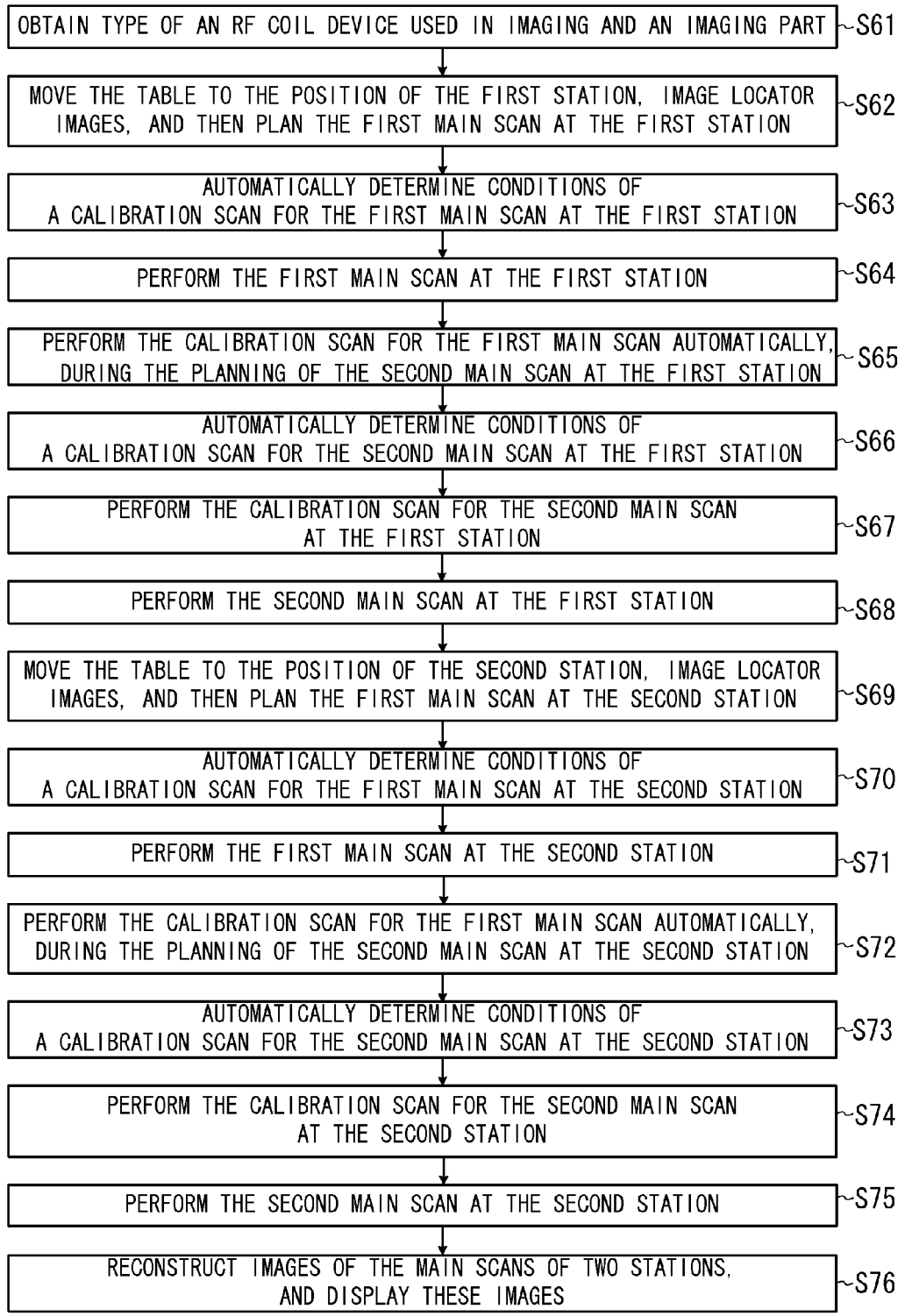
FIG. 13 is a flowchart illustrating a flow of a process performed by the MRI apparatus of the fourth embodiment.

FIG. 13 is a flowchart illustrating a flow of a process performed by the MRI apparatus 20 of the fourth embodiment. In the following, according to the step numbers in the flowchart shown in FIG. 13, an operation of the MRI apparatus 20 of the fourth embodiment will be described.

[Step S61] This Step S61 is the same as the step S21 of the second embodiment, and overlapping explanation is abbreviated.

[Step S62] The sequence controller 56 moves the table 32a on which the object P is set to the position of the first station in the imaging space, by driving the bed controlling device 50 under the command from the MPU 86.

Next, under the control of the MPU 86, locator images at the position of the first station are imaged and displayed in the aforementioned manner. Then, setting (planning) of the imaging conditions of the first main scan at the first station is performed by a user.

[Step S63] The calibration scan setting unit 100 automatically selects (a) sequence(s) performed as the calibration scan for the first main scan at the first station based on the imaging conditions of the first main scan at the first station (including the imaging part and the type of RF coil device). Then, the calibration scan setting unit 100 calculates and automatically sets conditions of each of the selected sequence(s) in the way similar to the step S44 in the third embodiment. Here, as an example, it is assumed that only a sequence capable of being performed after the main scan is selected.

[Step S64] When "a start command of the first main scan at the first station" is inputted by a user via the input device 62, the MPU 86 makes the MRI apparatus 20 perform the first main scan at the first station in the way similar to the aforementioned method.

[Step S65] The locator images at the first station are displayed, and setting (planning) of the imaging conditions of the second main scan at the first station is performed by a user via the input device 62, in the way similar to the aforementioned manner.

During the planning span by a user, the MPU 86 makes the MRI apparatus 20 perform the calibration scan(s) for the first main scan at the first station whose conditions are automatically set in the step S63.

The span during which planning is performed by a user is, in other words, a period during which the imaging conditions are being set for the MPU 86 via the input device 62.

When the planning of the imaging conditions of the second main scan at the first station and the calibration scan(s) for the first main scan at the first station are finished, the MPU 86 brings forward the process to the next step.

[Step S66] The calibration scan setting unit 100 automatically selects (a) sequence(s) performed as the calibration scan for the second main scan at the first station based on the imaging conditions of the second main scan at the first station (including the imaging part and the type of RF coil device). Then, the calibration scan setting unit 100 calculates and automatically sets conditions of each of the selected sequence(s) in the way similar to the aforementioned manner.

[Step S67] When a start command of the second main scan at the first station is inputted via the input device 62, the MPU 86 makes the MRI apparatus 20 perform the calibration scan(s) for the second main scan at the first station in the way similar to the aforementioned method. When the calibration scan(s) performed in this step include(s) a sequence which should be performed before the main scan like the magnetic field measuring sequence, the MPU 86 determines(modifies) some of the imaging conditions of the second main scan at the first station in such a manner that the execution result of this calibration scan is reflected.

[Step S68] The MPU 86 makes the MRI apparatus 20 perform the second main scan at the first station by controlling each component of the MRI apparatus 20.

[Step S69] The sequence controller 56 moves the table 32a on which the object P is set to the position of the second station, by driving the bed controlling device 50 under the command from the MPU 86. Next, at the position of the second station, locator images are imaged and displayed in the aforementioned manner. Then, setting (planning) of the imaging conditions of the first main scan at the second station is performed by a user.

[Step S70] The calibration scan setting unit 100 automatically selects (a) sequence(s) performed as the calibration scan for the first main scan at the second station based on the imaging conditions of the first main scan at the second station. Then, the calibration scan setting unit 100 calculates and automatically sets conditions of each of the selected sequence(s) in the way similar to the aforementioned manner. Here, as an example, it is assumed that only a sequence capable of being performed after the main scan is selected.

[Step S71] When a start command of the first main scan at the second station is inputted via the input device 62, the MPU 86 makes the MRI apparatus 20 perform the first main scan at the second station in the way similar to the aforementioned manner.

[Step S72] The locator images at the second station are displayed, and setting (planning) of the imaging conditions of the second main scan at the second station is performed by a user via the input device 62, in the way similar to the aforementioned manner.

During the planning span by a user, the MPU 86 makes the MRI apparatus 20 perform "the calibration scan(s) for the first main scan at the second station" whose conditions are automatically set in the step S70.

When the planning of the imaging conditions of the second main scan at the second station and the calibration scan(s) for the first main scan at the second station are finished, the MPU 86 brings forward the process to the next step.

[Step S73] The calibration scan setting unit 100 automatically selects (a) sequence(s) performed as the calibration scan for the second main scan at the second station based on the imaging conditions of the second main scan at the second station. Then, the calibration scan setting unit 100 calculates and automatically sets conditions of each of the selected sequence(s) in the way similar to the aforementioned manner.

[Step S74] When a start command of the second main scan at the second station is inputted via the input device 62, the MPU 86 makes the MRI apparatus 20 perform the calibration scan(s) for the second main scan at the second station in the way similar to the aforementioned manner. When the calibration scan(s) performed in this step include(s) a sequence which should be performed before the main scan, the MPU 86 determines(modifies) some of the imaging conditions of the second main scan at the second station in such a manner that the execution result of this calibration scan is reflected.

[Step S75] The MPU 86 makes the MRI apparatus 20 perform the second main scan at the second station by controlling each component of the MRI apparatus 20.

[Step S76] The image data of the main scans of the two stations are reconstructed and stored in the way similar to the step S36 in the second embodiment (if the sequence of generating the sensitivity distribution map is performed, the above luminance correction processing is performed on the reconstructed image data).

Based on these image data, display image data are generated and displayed on the display device 64 as images. The foregoing is a description of an operation of the MRI apparatus 20 according to the fourth embodiment.

As just described, according to the MRI apparatus 20 of the fourth embodiment, the same effects as the third embodiment are obtained in multi-station imaging. Note that, in the fourth embodiment, an example of two station imaging in which the number of step movement is three has been explained. The step movement is a set of movement of the table 32a and imaging. However, the number of step movement may be three or more than 3.

Supplementary Notes on Embodiments

[1] In each of the above embodiments, the magnetic field measuring sequence of calculating the offset magnetic field, the sequence of generating the sensitivity distribution map and the sequence of calculating a corrected value of the center frequency of RF pulses are explained as examples of calibration scans (in the narrow sense). However, the embodiments of the present invention are not limited to such an implementation.

These sequences are only examples of calibration scans (in the narrow sense), and, for example, when the sequence of the main scan is EPI, the sequence of obtaining phase correction data of EPI may be performed as a calibration scan.

[2] Execution of a calibration scan (in the narrow sense) is not limited to a case where the calibration scan is executed before the main scan corresponding to this calibration scan or a case where the calibration scan is executed after the main scan corresponding to this calibration scan. For example, some of the calibration scans may be executed before the main scan and the rest of the calibration scans may be executed after the main scan.

Figure 14:
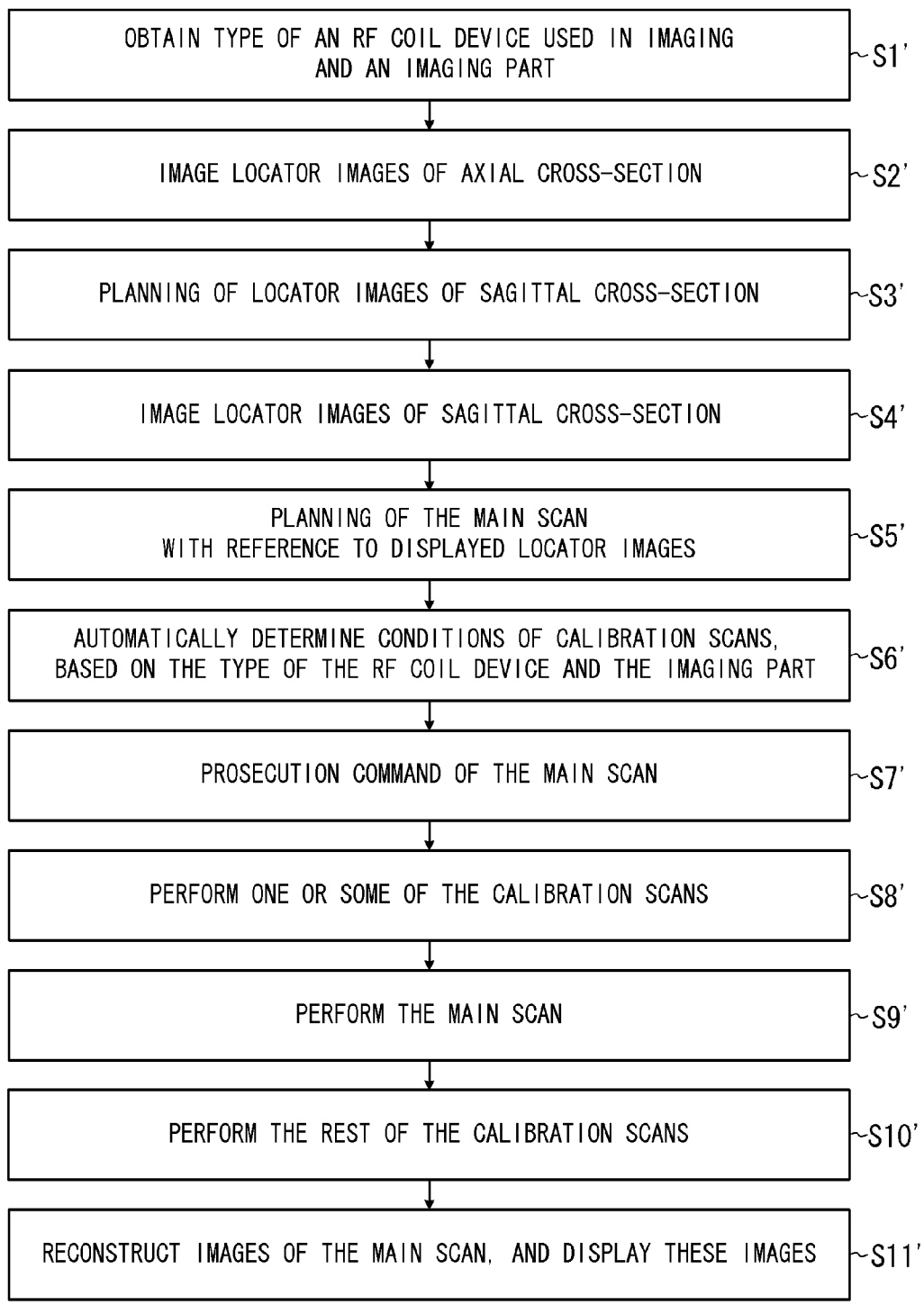
FIG. 14 is a flowchart illustrating a flow of a process performed by the MRI apparatus, in the case of the modified embodiment of the first embodiment where a portion of calibration scans are performed before the main scan and the rest of the calibration scans are performed after the main scan.

FIG. 14 is a flowchart illustrating a flow of a process performed by the MRI apparatus 20, in the case of the modified embodiment of the first embodiment where one or some of the calibration scans are performed before the main scan and the rest of the calibration scans are performed after the main scan.

Operations of the step S1' to S7' and S9' are the same as the operations of the step S1 to S7 and S9 in the first embodiment, respectively.

In the step S8', the MPU 86 makes the MRI apparatus 20 perform the calibration scan(s) which should be performed before the main scan such as the magnetic field measuring sequence of calculating the offset magnetic field to correct the static magnetic field and the sequence of calculating a corrected value of the center frequency of RF pulses in the main scan.

Note that, as described earlier, the magnetic field measuring sequence and the sequence of calculating a corrected value of the center frequency of RF pulses in the main scan may be performed as one sequence (one calibration scan). Additionally, when the calibration scan(s) which should be performed before the main scan is not selected, the step S8' is omitted.

In the step S10', the MPU 86 makes the MRI apparatus 20 perform the calibration scan(s) which can be performed after the main scan such as the sequence for generating the sensitivity distribution map of respective coil elements in (an) RF coil device(s). In the following step S11', reflecting the execution result of the calibration scan executed after the main scan, image reconstruction and image display are performed in the way similar to the step S10 in the first embodiment.

[3] In the above embodiments, an example in which conditions of each calibration scan are calculated and automatically set depending on the type of (an) RF coil device(s) and the imaging part. The imaging part as judgment standard for conditions of the calibration scan mentioned in the above embodiments includes, for example, an SAR detection part which includes the imaging part.

The above SAR (Specific Absorption Ratio) means, for example, energy of the RF pulse absorbed by 1 kg of living tissue. As safety standards, it is prescribed that an SAR value for an arbitrarily set period of 10 seconds and an SAR value for an arbitrarily set period of 6 minutes do not exceed a first upper limit and a second upper limit, respectively. Although explanation of SAR is omitted in each of the above embodiments, the MPU 86 and the calibration scan setting unit 100 restrict conditions of calibration scans and imaging conditions of main scans in such a manner that an SAR value does not exceed the upper limit in runtime of a calibration scan or a main scan.

In the case of imaging one hand, the SAR part is, for example, a region including one hand under the state where the object P is laid on the table 32a with his arms stretched and is a region combining both hands, both wrists and the lumber part. Additionally, in the case of imaging the heart, the SAR part is, for example, a region including the heart under the state where the object P is laid on the table 32a and is a region combining the chest part and both brachial regions.

Thus, in other words, each of the above embodiments may be configured to automatically calculate and automatically set conditions of calibration scans depending on the type of (an) RF coil device(s) and an SAR detection part.

[4] When a sequence which should be executed before a main scan is not selected as the a calibration scan and shortening of imaging time is the first priority, the flow of the third embodiment is more preferable than the flow of the first embodiment in which (all) the calibration scans are performed just before the main scan. The flow of the third embodiment means a flow in which the first main scan is performed, and then a calibration scan targeting for the executed first main scan is performed during a planning span of the imaging conditions of the second main scan performed afterward.

On the other hand, when it is desired to calibrate the imaging conditions of the main scan (acquisition conditions of MR signals such as application conditions of a static magnetic field and the center frequency of RF pulse) before the main scan, the flow of the first embodiment in which the calibration scans are performed just before the main scan is preferable. Two examples are given for this point as follows.

Firstly, for example, in DWI (Diffusion Weighted Imaging), imaging operations whose b-factor and an application direction of MPG (Motion Probing Gradient) are mutually different are performed in series. Thus, in DWI, the gradient magnetic field coil 26 heats up, iron shim trays heat up, and their magnetic permeability changes, uniformity of magnetic field is degraded, and the center frequency of magnetic resonance of hydrogen atoms shifts. Therefore, it is preferable to perform the sequence of calculating a corrected value of the center frequency of RF pulses under application of the static magnetic field corrected based on the offset magnetic field obtained by performing the aforementioned magnetic field measuring sequence just before the corresponding main scan, correct the center frequency of RF pulses to the newly calculated value, and continue the main scan of DWI.

Secondly, for example, because a lot of fat tissues and air (in the lungs) are included in breast imaging, breast imaging is easily influenced by a shift of the center frequency of RF pulses. Therefore, in breast imaging, it is preferable to perform the sequence of calculating a corrected value of the center frequency of RF pulses just before the main scan including a fat-suppression prepulse. More specifically, with temperature increase of the gradient magnetic field coil 26 according to elapse of imaging time, the center frequency of magnetic resonance of hydrogen atoms changes and shifts according to elapsed time. Considering this point, the closer the execution timing of the calibration scan is to the timing right before the main scan, the more appropriately the center frequency is corrected, because conditions of the calibration scan at its execution timing become closer to conditions of the main scan at its execution timing.

[5] An example has been described in which (as the MRI apparatus 20) the RF receiver 48 is disposed outside the gantry that includes the static magnetic field magnet 22, the shim coil 24, the gradient magnetic field coil unit 26, and the RF coils 28 (see FIG. 1). However, the embodiment of the present invention is not limited to such an implementation. The RF receiver 48 may be included in the gantry.

Specifically, for example, an electronic circuit board that is equivalent to the RF receiver 48 may be disposed in the gantry. Then, the MR signals, which are analog electrical signals converted from the electromagnetic wave by the receiving RF coil 28, may be amplified by a pre-amplifier in the electronic circuit board, the amplified signals may be outputted to the outside of the gantry as digital signals and inputted to the sequence controller 56. In outputting the signals to the outside of the gantry, for example, an optical communication cable is preferably used to transmit the signals in the form of optical digital signals. This is because the effect of external noise is reduced.

[6] In the first embodiment, an example in which locator images of the axial cross-section and the sagittal cross-section are imaged. However, the embodiment of the present invention is not limited to such an implementation. Locator images of another cross-section such as the coronal cross-section may be imaged. This point applies to the second to fourth embodiments.

[7] In the first to fourth embodiments, an example in which respective conditions of a calibration scan are automatically calculated by the MRI apparatus 20 and the respective conditions of the calibration scan are automatically set to the automatically calculated conditions. However, the embodiments of the present invention are not limited to such an implementation.

For example, the MRI apparatus 20 may be configured to display (propose or indicate) the respective conditions of the calibration scan automatically calculated. In this configuration, the calibration scan setting unit 100 automatically sets conditions of the calibration scan to the displayed conditions, when a user inputs a confirm command (permission command) for the displayed conditions via the input device 62.

[8] Correspondences between terms used in the claims and terms used in the embodiment described above will be described. Note that the correspondences described below are just some of possible interpretations for reference and should not be construed as limiting the present invention.

The functions of the entirety of the static magnetic field magnet 22, the shim coil 24, the gradient magnetic field coil 26, the RF coils 28 and the control device 30 (see FIG. 1) that acquires MR signals with application of gradient magnetic fields and executes calibration scans are an example of the calibration scan executing unit described in the claims.

The entire configuration of the static magnetic field magnet 22, the shim coil 24, the gradient magnetic field coil 26, the RF coils 28 and the control device 30 that acquires MR signals from the imaging region including the imaging part of the object P with application of a static magnetic field, gradient magnetic fields and RF pulses, under the determined imaging conditions of the main scan are an example of the main scan executing unit described in the claims.

The function of the image reconstruction unit 90 that reconstructs image data of the imaging part of the object P, based on the acquired MR signals is an example of an image reconstruction unit described in the claims.

The sensitivity distribution map used in luminance correction after image reconstruction is an example of a condition of correction processing described in the claims.

The corrected value of the center frequency of RF pulses calculated based on the execution results of a calibration scan is an example of a condition of the main scan described in the claims.

The function of the MPU 86 that determines some of the undetermined imaging conditions of the main scan and conditions of correction processing for reconstructed image data, based on the execution results of a calibration scan is an example of the condition determining unit described in the claims.

The function of the sequence controller 56 that drives the bed controlling device 50 under the command of the MPU 86 and the bed controlling device 50 that moves the table 32a with the object P set thereon to a predetermined position in the imaging space are an example of bed driving unit described in the claim.

[9] While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus that (1) executes, as a main scan, an operation of transmitting an RF pulse based on a determined imaging condition and acquiring nuclear magnetic resonance signals via an RF coil device set on a part of an object to be imaged and (2) reconstructs image data of the imaged part based on the nuclear magnetic resonance signals acquired in the main scan, the magnetic resonance imaging apparatus comprising:
control computer circuits configured to
calculate a condition of a calibration scan for determining an imaging condition of the main scan or a condition of correction processing of the image data, wherein the condition of the calibration scan is set based on a type of said RF coil device and the imaged part, among conditions in including (a) a condition which is set regardless of the imaging condition of the main scan and (b) (a condition which is set by referring to the imaging condition of the main scan);
execute the calibration scan based on the condition of the calibration scan; and
determine the imaging condition of the main scan or the condition of the correction processing, based on the execution result of the calibration scan.

2. The magnetic resonance imaging apparatus according to claim 1, wherein:
the control computer circuits are configured to set the condition of the calibration scan to a calculated condition after calculating the condition of the calibration scan.

3. The magnetic resonance imaging apparatus according to claim 2, wherein:
the calibration scan is a scan to adjust a condition having influence on image quality.

4. The magnetic resonance imaging apparatus according to claim 3 wherein:
the control computer circuits are configured to
calculate a condition of a sensitivity distribution map sequence in which the nuclear magnetic resonance signals used to calculate a sensitivity distribution map of a plurality of coil elements inside the RF coil device are acquired via the plurality of coil elements;
execute the sensitivity distribution map sequence as the calibration scan;
perform luminance correction on the image data by using the sensitivity distribution map calculated based on the nuclear magnetic resonance signals acquired in the sensitivity distribution map sequence, as the correction processing.

5. The magnetic resonance imaging apparatus according to claim 4, wherein:
the control computer circuits are configured to
calculate a condition of a magnetic field measuring sequence to measure distribution of magnetic field intensity of an imaging space where the object is put;
execute the magnetic field measuring sequence as the calibration scan;
execute the main scan under application of a static magnetic field corrected by the distribution of magnetic field intensity obtained by the magnetic field measuring sequence.

6. The magnetic resonance imaging apparatus according to claim 3, further comprising:
a bed driving unit configured to sequentially repeat a step movement of a table on which the object with the RF coil device set on is put and a temporary stop of the table, to change the imaging part;
wherein each time the step movement is executed, the calibration scan is executed and the main scan is executed according to imaging conditions determined by an execution result of a latest calibration scan.

7. The magnetic resonance imaging apparatus according to claim 1, wherein:
the control computer circuits are configured to indicate a calculated condition of the calibration scan after calculating the condition of the calibration scan.

8. A magnetic resonance imaging apparatus that (1) executes, as a main scan, an operation of transmitting an RF pulse based on determined imaging conditions and acquiring nuclear magnetic resonance signals via an RF coil device set on a part of an object to be imaged and (2) reconstruct image data of the imaging part based on the nuclear magnetic resonance signals acquired in the main scan, the magnetic resonance imaging apparatus comprising;
control computer circus configured to classify conditions of a calibration scan for determining an imaging condition of the main scan or a condition of correction processing of the image data into a condition fixed regardless of the imaging conditions of the main scan, a condition to which a content of a corresponding condition of the main scan is applied without modification and a condition calculated based on at least one of the imaging conditions of the main scan, and calculate the conditions of the calibration scan based on at least one of the imaging conditions of the main scan;
execute the calibration scan based on the conditions of the calibration scan; and
determine the imaging conditions of the main scan or the condition of the correction processing, based on an execution result of the calibration scan.

9. The magnetic resonance imaging apparatus according to claim 8, wherein:
the control computer circuits are configured to set the conditions of the calibration scan to calculated conditions, after calculating the conditions of the calibration scan.

10. The magnetic resonance imaging apparatus according to claim 9, wherein:
the control computer circuits are calibration scan is a scan to adjust conditions having influence on image quality.

11. A magnetic resonance imaging apparatus that (1) executes, as a main scan, an operation of transmitting an RF pulse based on determined imaging conditions and acquiring nuclear magnetic resonance signals via an RF coil device set on a part of an object to be imaged and (2) reconstructs image data of the imaged part based on the nuclear magnetic resonance signals acquired in the main scan, the magnetic resonance imaging apparatus comprising:
control computer circuits configured to
select a sequence executed as a calibration scan for determining an imaging condition of the main scan or a condition of correction processing for the image data out of a plurality of sequences stored as options based on at least one of imaging conditions of the main scan, and calculate a condition of a selected sequence;
the selected sequence as the calibration scan, based on the condition set by the calibration scan setting unit; and
determine the imaging condition of the main scan or the condition of the correction processing, based on an execution result of the calibration scan.

12. The magnetic resonance imaging apparatus according to claim 11, wherein:
the control computer circuits are configured to set the condition of the calibration scan to a calculated condition, after calculating the condition of the calibration scan.

13. The magnetic resonance imaging apparatus according to claim 12, wherein:
the calibration scan is a scan to adjust a condition having influence on image quality.

14. The magnetic resonance imaging apparatus according to claim 13, wherein:
the control computer circuits are configured to execute the calibration scan after an execution command of the main scan is inputted to the magnetic resonance imaging apparatus and before execution of the main scan.

15. The magnetic resonance imaging apparatus according to claim 14, wherein:
the control computer circuits are configured to store, as the options,
(a) a sensitivity distribution map sequence in which the nuclear magnetic resonance signals used to calculate a sensitivity distribution map of a plurality of coil elements inside the RF coil device are acquired via the plurality of coil elements;
(b) a magnetic field measuring sequence to measure distribution of magnetic field intensity of an imaging space used for correction to uniformize a static magnetic field applied to the imaging space where the object is put in the main scan; and
(c) a center frequency sequence in which the nuclear magnetic resonance signals used for calculation of a center frequency of the RF pulse are acquired.

16. The magnetic resonance imaging apparatus according to claim 15, wherein:
the control computer circuits are configured to execute the main scan under application of a static magnetic field corrected based on the distribution of magnetic field intensity, when the magnetic field measuring sequence is executed as the calibration scan.

17. The magnetic resonance imaging apparatus according to claim 15, wherein the control computer circuits are configured to perform luminance correction as the correction processing on the image data by using the sensitivity distribution map calculated based on the nuclear magnetic resonance signals acquired in the sensitivity distribution map sequence, when the sensitivity distribution map sequence is executed as the calibration scan.

18. The magnetic resonance imaging apparatus according to claim 15, wherein:
the control computer circuits are configured to execute the main scan with application of the RF pulse whose center frequency is a value calculated based on the nuclear magnetic resonance signals acquired in the center frequency sequence, unit executes the center frequency sequence is executed as the calibration scan.

19. The magnetic resonance imaging apparatus according to claim 15, wherein:
when a second main scan is executed after executing a first main scan, a sequence of the calibration scan is selected, calculated and set for the first main scan based on at least one of imaging conditions of the first main scan and the calibration scan is executed for the first main scan under the set condition while imaging conditions of the second main scan are set, after execution of the first main scan.

20. The magnetic resonance imaging apparatus according to claim 19, wherein the control computer circuits are configured to perform luminance correction as the correction processing on the image data by using the sensitivity distribution map calculated based on the nuclear magnetic resonance signals acquired in the sensitivity distribution map sequence, when the sensitivity distribution map sequence is executed as the calibration scan.

* * * * *